United States Patent [19]
Watanabe et al.

[11] Patent Number: 5,560,870
[45] Date of Patent: Oct. 1, 1996

[54] COMPOSITION FOR FORMING AN ELECTRICALLY CONDUCTIVE LAYER TO BE USED IN PATTERNING

[75] Inventors: Keiji Watanabe; Yasuhiro Yoneda; Takashi Maruyama; Keiko Yano, all of Kawasaki; Tomio Nakamura, Yokohama; Shigeru Shimizu, Yokohama; Takashi Saitoh, Yokohama, all of Japan

[73] Assignees: Fujitsu Limited, Kawasaki; Nitto Chemical Industry Co., Tokyo, both of Japan

[21] Appl. No.: 445,730

[22] Filed: May 22, 1995

Related U.S. Application Data

[63] Continuation of Ser. No. 77,650, Jun. 17, 1993, abandoned.

[30] Foreign Application Priority Data

Jun. 17, 1992 [JP] Japan ..................... 4-157953

[51] Int. Cl.$^6$ ............................. H01B 1/00; H01B 1/18
[52] U.S. Cl. ..................... 252/500; 528/210; 528/214; 528/422; 528/423
[58] Field of Search ................. 252/500; 528/422, 528/423, 210, 214

[56] References Cited

U.S. PATENT DOCUMENTS

| | | | |
|---|---|---|---|
| 4,772,421 | 9/1988 | Ikenaga et al. | 252/500 |
| 4,959,180 | 9/1990 | Armes et al. | 252/519 |
| 5,006,278 | 4/1991 | Elsenbaumer | 252/500 |
| 5,109,070 | 4/1992 | Epstein et al. | 525/189 |
| 5,115,057 | 5/1992 | Ono et al. | 526/256 |
| 5,198,153 | 3/1993 | Angelopoulos et al. | 252/500 |
| 5,240,644 | 8/1993 | Barry, Jr. et al. | 252/500 |

FOREIGN PATENT DOCUMENTS

| | | |
|---|---|---|
| 3-88819 | 4/1991 | Japan . |
| 91/06887 | 5/1991 | WIPO . |

OTHER PUBLICATIONS

Yano et al., "Polymer Film Coated Electrodes Prepared by Electroxidation of Aniline Derivatives," *The Chemical Society of Japan*, 1985, vol. 6, pp. 1124–1130. (See English language abstract at pp. 1129–1139.).
Angelopoulos et al., "'Pseudo–Protonic Acid Doping' of Polyaniline," *Mol. Cryst. Liq. Cryst.*, 1988, vol. 100, p. 223.
Angelopoulos et al., "Polyaniline: Solutions, Films and Oxidation State," *Mol. Cryst. Liq. Cryst.*, 1988, vol. 160, pp. 151–163.
Ray et al., "Electrochemistry of Ring–Substituted Polyanilines: Effect of Substituents on Electronic Properties," *Mol. Cryst. Liq. Cryst.*, 1988, vol. 160, p. 221.
Yue et al., "Synthesis of Self–Doped Conducting Polyaniline," *J. Am. Chem. Soc.*, 1990, vol. 112, pp. 2800–2801.
Yue et al., "Effect of Sulfonic Acid Group on Polyaniline Backbone," *J. Am. Chem. Soc.*, 1991, vol. 113, pp. 2665–2671.

*Primary Examiner*—Paul Lieberman
*Assistant Examiner*—M. Kopec
*Attorney, Agent, or Firm*—Staas & Halsey

[57] ABSTRACT

A composition for forming an electrically conductive layer which is used in patterning of a resist with electric charge beam, which comprises:

(a) 0.1 to 20 parts by weight of sulfonated polyanilines with a sulfonic group content ranging from 20 to 80% based on the aromatic ring, the sulfonated polyaniline having a weight average molecular weight of 500 to 100,000 and a molecular weight dispersion of not more than 5, (b) 100 parts by weight of a solvent, and (c) 0.01 to 30 parts by weight of amines and/or quaternary ammonium salts, and if desired, it further comprises 0 to 200 parts by weight of the following substance(s) (A) and/or (B) as component (d):

(A) a high molecular weight compound soluble in the aforesaid solvent (b), (B) a surface active agent.

7 Claims, 20 Drawing Sheets

CONNECTION LINE OF SUBFIELDS → SAMPLE NO.4 IN TABLE 1

2μm

SAMPLE NO.6 IN TABLE 1

2μm

CONNECTION LINE OF SUBFIELDS

SAMPLE NO.6 IN TABLE 1

0.05 μm

SAMPLE NO.4 IN TABLE 1

0.05 μm

CMR RESIST

COMPOSITION FOR FORMING AN ELECTRICALLY CONDUCTIVE LAYER TO BE USED IN PATTERNING

This application is a continuation of application No. 08/077,650, filed Jun. 17, 1993, now abandoned.

BACKGROUND OF THE INVENTION

1. Field of the Invention

The present invention relates to a composition for forming an electrically conductive layer and a process for forming a pattern using said composition. More specifically, the present invention relates to such a composition for pattern formation used for preventing charge-up occurring in electron beam lithography or focusing ion beam lithography, and a process for the formation of a resist pattern by use of said composition. The present invention relates also to such a composition for preventing charge-up occurring in an ion-implantation step and an ion-implantation process by use of said composition.

2. Description of the Related Art

In order to form an electron circuit element having a fine pattern, e.g., a semiconductor device or the like, a thin film formation technique and photolithographic etching technique have often been used. That is, a thin film layer such as an electrically conductive layer and insulating layer are formed on a substrate to be processed, by a method such as a puttering method and chemical vapor deposition method, following which a resist (photosensitive resin) is coated on the thin film layer by a method such as spin coating, and subsequently exposed to light, whereupon a pattern is formed by utilization of the phenomenon that a difference is caused in developing characteristics between the exposed part and unexposed part, e.g., that there is caused a difference therebetween in solubility to the developing solution, or the like. Wet etching or dry etching is conducted by use of this resist pattern as a mask, whereby a fine conductor pattern or insulating pattern is formed on a substrate to be processed.

As the light source in the exposure of a resist, there are used ultraviolet rays, X-rays, an electron beam, focusing ion beam and the like. Among them, according to electron beam lithography, a pattern can be directly drawn on a resist by scanning an electron beam, and therefore, the electron beam lithography has been widely used for the formation of a photomask or prototype logical circuit, for the production of a modicum-multikind type LSI such as an ASIC, which has recently presented increasing demand, and so forth. In addition, a focusing ion beam, also capable of effecting direct drawing, is scarcely scattered in a resist and therefore, exhibits a satisfactory rectilinear propagation property and excellent definition, and applications of focusing beam to specific devices requiring fine processing have been examined.

However, since a resist for an electron beam or focusing ion beam is an insulating material, when exposing it by use of an electron beam or ion beam, accumulation of an electric charge occurs, i.e., a charge-up phenomenon, which causes misregistration of a resist pattern. This misregistration becomes relatively higher as the pattern becomes finer, and has become a serious problem with the recently advanced integration of circuits. In addition, in the ion implantation step in the production of semiconductors, the ion-implantation is conducted through an insulating film such as an oxide film or resist, and a charge-up phenomenon occurs owing to the ion. Since a charge-up phenomenon causes an unevenness of ion distribution, lowering of ion-implantation controllability, and further dielectric breakdown of the substrate, this phenomenon is disadvantageous in that it adversely effects the properties of the device, thus lowering the reliability thereof.

Some techniques concerning charge-up prevention have already been reported. For example, attempts have been made to coat, on a pattern formation resist, aluminium (Japanese Unexamined Patent Publication (Kokai) No. 63-226926), ammonium polystyrenesulfonate (Japanese Unexamined Patent Publication (Kokai) No. 64-37015) or the like, in order to prevent the charge-up. The method of coating aluminum has the disadvantage that the steps become complicated. On the other hand, the process using ammonium polystyrenesulfonate has the defect that the charge-up-preventing effect is not satisfactory, though its steps are simple.

In addition, a report has been made that a composition containing a polymer of thienyl alkane sulfonic acid compound is useful as an antistatic agent (Japanese Unexamined Patent Publication (Kokai) No. 2-247219). However, this composition exhibits a strong acidity, for it contains a non-oxidative proton, and when a pattern is formed by use of the composition, an adverse effect is exerted upon the resist, element, wiring material or the like. Further, this composition causes practical disadvantages in that the production of a monomer becomes difficult, that disposal of waste liquid becomes complicated when producing semiconductors, and the like. In addition, a report has been made that an aqueous solution of a sulfonated polyaniline compound may be used as an antistatic agent (Japanese Unexamined Patent Publication (Kokai) No. 4-32848). However, this technical idea has the disadvantage that, since the structure of the polymer, the base to be blended, the solvent to be used and the like are not optimum, the conductivity is insufficient and charge-up cannot sufficiently be prevented.

On the other hand, the present inventors have proposed a process using a TCNQ complex as a conductive component (Japanese Unexamined Patent Publication (Kokai) No. 3-87743). Although this process is simple and its effects are satisfactory, since a ketone type or ether type organic solvent is used as a solvent, when a resist soluble in any of these solvents is used, it happens that the used solvent forms a mixed layer with the resist, the properties thereof being deteriorated. In addition, as the charge-up prevention method which has now been actually practiced in an ion-implantation step, there have been practiced a method of lowering the charge density, that of applying an electron shower onto a wafer, and the like. However, no definitive effect can be obtained by any of these methods.

SUMMARY OF THE INVENTION

The present invention has been made in order to solve the aforesaid various problems, and the purpose of the present invention is to provide a composition for forming an electrically conductive layer used for pattern formation, the production step of which is simple, which may have universal uses, and which is excellent in the effects of preventing misregistration, dimensional error, and the like, and a process for the formation of a resist pattern by use of this composition. Another purpose of the present invention is to propose a charge-up prevention method, which can effectively be worked out without having an adverse effect on the ion-implantation process. In order to achieve the above purpose, the composition of the present invention comprises:

(a) 0.1 to 20 parts by weight of a sulfonated polyaniline having a sulfonic group ranging 20 to 80% by number based on the number of aromatic rings of the sulfonated polyaniline, a weight average molecular weight of 300 to 500,000 and a molecular weight dispersion of not more than 5.0, (b) 100 parts by weight of a solvent, and (c) 0.01 to 30 parts by weight of an amine and/or quaternary ammonium salt.

This composition will be hereinafter referred to as "the first composition".

The composition of the present invention further contains, if desired, up to 200 parts by weight of the following (A) and/or (B) as component (d):

(A) a high molecular weight compound soluble in the aforesaid solvent (b), (B) a surface active agent.

This composition containing also (A) and/or (B) will be hereinafter referred to as "the second composition".

In addition, the process for the formation of a pattern according to the present invention comprises the steps of:

forming a resist layer on a substrate, coating and drying a composition as set forth in claim 1 on said resist layer to form an electrically conductive layer on said resist layer, scanning an electrically charged beam on said substrate with the resist and electrically conductive layers for exposure for patterning, and removing said electrically conductive layer and developing said resist layer to form a resist pattern on said substrate.

This process for the formation of a pattern (hereinafter referred to as "the first pattern formation process") is an example in which a conductive film is formed on the uppermost layer of a resist.

Further, the present process for the formation of a pattern comprises the steps of:

forming a first resist layer on a substrate, coating and drying a composition as set forth in claim 1 on said first resist layer to form an electrically conductive layer on said first resist layer, forming a second resist layer on said electrically conductive layer, scanning an electrically charged beam onto said substrate with said layers for exposure for patterning, developing said second resist layer to form a pattern of said second resist layer, and etching said electrically conductive layer and first resist layer using said second resist layer pattern as a mask to form a multilayer resist pattern on said substrate.

The above process for the formation of a pattern (hereinafter referred to as "the second pattern formation process") is an example in which a conductive layer is formed in the upper layer of the intermediate layers in a multilayer resist structure.

In addition, the present process for the formation of a pattern comprises the steps of:

coating and drying a composition as set forth in claim 1 on a substrate to form an electrically conductive layer on said substrate, forming a resist layer on said electrically conductive layer, scanning an electrically charged beam onto said substrate with the electrically conductive and resist layers for patterning exposure, and developing said resist and electrically conductive layers to form a multilayer resist pattern on said substrate.

The above process for the formation of a pattern (hereinafter referred to as "the third pattern formation process") is an example in which a conductive film is used as a flattened layer in a multilayer resist structure.

Further, an ion-implantation method of the present invention comprises a step of coating and drying the aforesaid composition on a substrate to be processed, on which an ion-implantation mask has been formed, so as to form an electrically conductive film, on the substrate, and a step of conducting ion-implantation.

DESCRIPTION OF THE PREFERRED EMBODIMENTS

Figure 1:
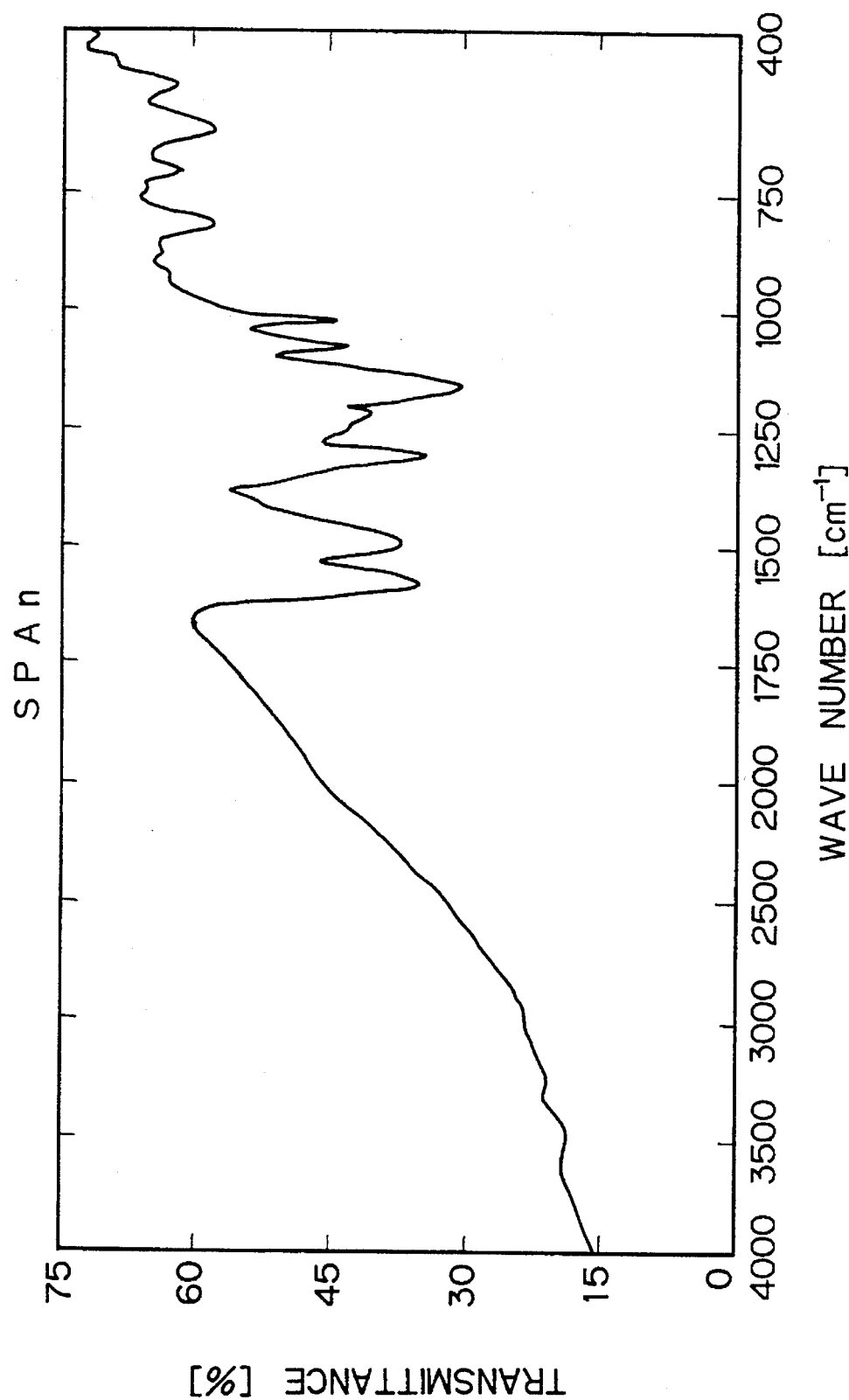
FIG. 1 is the IR spectra of the sulfonated polyaniline synthesized in Example 1, obtained by the KBr tablet method.

The sulfonated polyaniline (a) constituting the composition of the present invention is a compound represented by any of the following formulae (I) to (V), or a mixture of optionally combined sulfonated polyanilines of the formulae (I) to (V). Preferable sulfonated polyaniline is a compound represented by any of the formulae (I) to (III), or a mixture of optionally combined sulfonated polyanilines of the formulae (I) to (III).

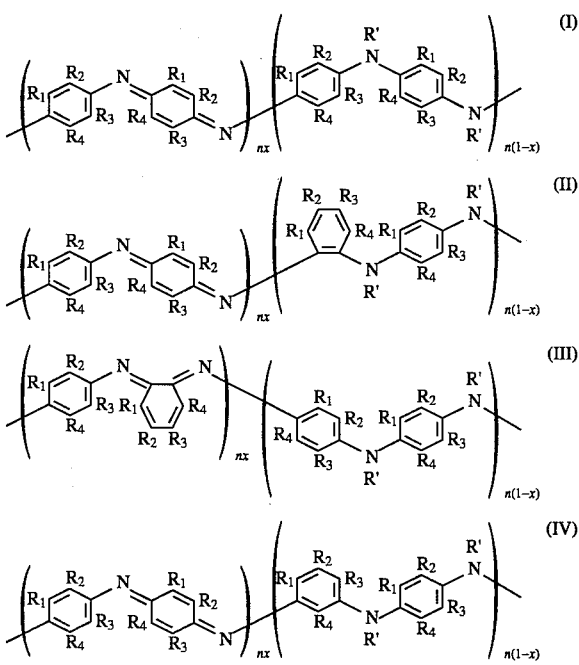

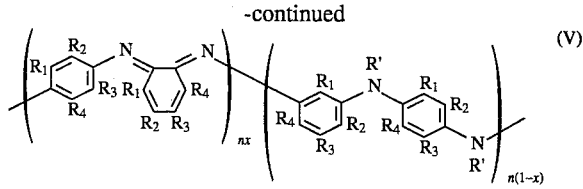

In the above formulae (I) to (V), $R_1$, $R_2$, $R_3$, and $R_4$ each denotes independently, a hydrogen atom, sulfonic group, methoxy group, an alkyl with 1 or 2 carbon atoms ($C_1$ to $C_2$ alkyl) or hydroxy group;

R' denotes a hydrogen atom or 1 to 4 carbon atoms-containing ($C_1$ to $C_4$) alkyl, preferably methyl group;

n denotes a polymerization degree; and x denotes an optional number between 0.2 to 0.8, preferably between 0.3 and 0.7.

Formula (I) indicates the presence of a p-bond alone, formula (II) and formula (III) the presence of both a p-bond and o-bond, formula (IV) the presence of both a p-bond and an m-bond, and formula (V) the presence of a p-bond, o-bond and m-bond.

As sulfonated polyanilines, the aforesaid component (a) constituting the composition of the present invention, there can be used, in addition to the compounds of the aforesaid formulae (I) to (V), various sulfonated polyanilines described in the Journal of the Chemical Society of Japan, 1985, 1124, Japanese Unexamined Patent Publication (Kokai) No. 61-197633, Japanese Unexamined Patent Publication (Kokai) No. 01-301714, J.Am. Chem. Soc., 1991, 113, 2665, J.Am. Chem. Soc., 1990, 112, 2800, and WO. 91/06887. In addition, sulfonated polyanilines obtained by various synthesizing processes may also be used, and among them, the sulfonated polyanilines or the like obtained by copolymerizing at least one compound selected from the group consisting of aniline, N-alkylaniline and phenylene-diamines and o-, m- or/and p-aminobenensulfonic acids, and sulfonating the obtained copolymers with a sulfonating agent are preferably used.

As the sulfonated polyaniline, the aforesaid component (a), there are preferred the ones in which sulfonic groups are contained in a proportional amount ranging from 20 to 80%, preferably from 30 to 70% based on the number of the aromatic rings, and aromatic rings having sulfonic groups and those having no sulfonic groups are connected in a suitably intermingled state, and more preferred are the ones in which the aromatic rings having sulfonic groups and those having no sulfonic groups are alternately arranged. When the sulfonic group content is less than 20%, the solubility is insufficient and the electrical conductivity of the obtained film becomes lowered. On the other hand, when this content exceeds 80%, there is recognized a tendency for the conductivity of the sulfonated polyaniline to also become lower.

A further preferred sulfonated polyaniline is one in which aromatic rings having both sulfone group and an alkoxy group, preferably methoxy group, are polymerized. This type sulfonated polyaniline can be easily synthesized due to a high reactivity, such that the subsequent sulfonation is not necessary, and the resultant sulfonated polyaniline has an extremely high electrical conductivity (less than $3.0 \times 10^5$ $\Omega/\square$ surface electrical resistance).

The sulfonated polyaniline used in the present invention should have a weight average molecular weight of 300 to 500,000 with a molecular weight dispersion of not more than 5.0, preferably a weight average molecular weight of 1,000 to 200,000 with a molecular weight dispersion of not more than 4.5, more preferably a weight average molecular weight of 2,000 to 100,000 with a molecular weight dispersion of not more than 4.0, further preferably a weight average molecular weight of 2,000 to 30,000 with a molecular weight dispersion of not more than 3.0, more preferably not more than 2.5. The molecular weight dispersion is defined as a ratio of weight average molecular weight ($\overline{Mw}$) to number average molecular weight ($\overline{Mn}$). If the molecular weight of the polymer is higher than the above or the molecular weight dispersion of the polymer is larger than the above, the solubility of the polymer is lowered and the resolution of resist is disadvantageously affected. If the molecular weight of the polymer is lower than the above, the film formability is deteriorated.

The sulfonated polyaniline having the above molecular weight feature can be synthesized, for example, by the following processes.

i) Aniline, phenylenediamine and diphenylphenylenediamine are copolymerized with aminobenzene sulfonate, followed by sulfonation.

ii) At least of aniline, phenylenediamine and diphenilenediamine are copolymerized with alcoxyaminobenzene sulfonate.

iii) Aniline is copolymerized with $H_2O_2$ under a Fe catalysit, followed by sulfonation.

The proportional amount of the sulfonated polyanilines, component (a), to be used is, as described above, within the range between 0.1 and 20 parts by weight based on 100 parts by weight of the solvent, component (b), preferably between 0.5 and 15 parts by weight. When the proportional amount of component (a) is less than 0.1 part by weight, pinholes are produced in the film, or the electrical conductivity of the film becomes inferior. On the other hand, when this proportional amount exceeds 20 parts by weight, the solubility and flatness of the film become worse and the electrical conductivity thereof is not increased, for it has already reached to its peak or saturated.

As the solvent, component (b) constituting the composition used in the present invention, there may be used water, mixtures of water and organic solvents or other organic solvents, and a solvent system forming a non-mixed layer with the resist may be selected in order not to have an adverse effect on the properties of the resist.

As the organic solvent, there are preferably used alcohols such as methanol, ethanol, propanol and isopropanol; ketones such as acetone and methyl isobutyl ketone; cellosolves such as methyl cellosolve, ethyl cellosolve, and ethyl cellosolve acetate; propylene glycols such as methyl propylene glycol and ethyl propylene glycol; amides such as dimethylformamide, and diethylacetamide; pyrrolidones such as N-methylpyrrolidone and N-ethylpyrrolidone, and the like. These solvents are used either each independently or as mixtures thereof in optional proportions. In addition, especially when water and any of these organic solvents are used as a mixture thereof, the coatability and electrical conductivity of the composition are increased. As concrete examples of the mixture, there may be mentioned the combinations such as water/methanol, water/ethanol, water/propanol, water/isopropanol, water/methyl propylene glycol, water/ethyl propylene glycol, and the like. As proportional amount between these solvents, there is preferred a range of the proportion of water/an organic solvent between 1/10 and 10/1, more preferably between 1.5/10 and 10/1.5. Further, as the amines and/or quaternary ammonium salts, component (c) of the composition used in the present invention, there are used the compounds represented by the following formula (VI) or (VII).

The structural formula of the amines to be used is represented by formula (VI):

wherein $R_5$ to $R_7$ denotes each independently a hydrogen atom, 1 to 4 carbon atoms-containing ($C_1$ to $C_4$) alkyl group, $CH_2OH$, $CH_2CH_2OH$, $CONH_2$ or $NH_2$, respectively. If $R_5$ to $R_7$ contain more than four carbon atoms, the electrical conductivity of the composition is lowered.

In addition, the structural formula of the ammonium salts to be used is represented as formula (VII).

wherein $R_5$ to $R_8$ denote each independently a hydrogen atom, 1 to 4 carbon atoms-containing ($C_1$ to $C_4$) alkyl group, $CH_2OH$, $CH_2CH_2OH$ and/or $NH_2$, respectively; and $X^-$ denotes $OH^-$, $1/2SO_4^{2-}$, $NO_3^-$, $1/2CO_3^{2-}$, $HCO_3^-$, $1/2.(COO)_2^{2-}$, $R'SO_3^-$ or $R'COO^-$ (wherein $R'$ is a 1 to 3 carbon atoms-containing ($C_1$ to $C_3$) alkyl group).

By compounding of the aforesaid constitutive component (c), the composition of the present invention can be maintained at a neutral to weak alkaline state, whereby facilitation of the treatment of chemicals, and reduction of the corrosion of the device and piping can favorably be contemplated. In addition, by use of these amines and ammonium salts as mixtures thereof, the conductivity of the composition can be improved. As concrete examples of such mixtures, there may be mentioned $NH_3/(NH_4)_2CO_3$, $NH_3/(NH_4)HCO_3$, $NH_3/CH_3COONH_4$, $N(CH_3)_3/(NH_4)_2CO_3$, $N(CH_3)_3/CH_3COONH_4$, $NH_3/(NH_4)_2SO_4$, $N(CH_3)_3/(NH_4)_2SO_4$ and the like. As the mixing ratio of the components in these mixtures, there is preferred the range between 1/10 and 10/1 as proportions of amines/ammonium salts.

The proportional amount of used amines and/or quaternary ammonium salts, constitutive component (c) of the present composition, is, as described above, within the range between 0.01 and 30 parts by weight, preferably between 0.5 and 20 parts by weight, based on 100 parts by weight of solvent (b).

When the proportion of component (c) is less than 0.01 part by weight, the solubility of component (b) is not sufficient, and, on the contrary, when this proportion exceeds 20 parts by weight, the solution exhibits strong basicity, and the conductivity of the composition becomes inferior. The pH value of the solution can be optionally controlled by changing the concentrations, kinds and mixing ratios of amines and/or quaternary ammonium salts, and the solution can be used within a pH value range between 5 and 12.

Although the present conductive composition for pattern formation can form a film of good quality even when it consists of only the three components, (a), (b), and (c), by addition of the aforesaid component (d), the planalization, coatability, electrical conductivity and the like thereof are further improved. As component (d), there are used any of the following compounds (A), high molecular weight compounds soluble in the aforesaid solvent (b) and/or surface active agents (B).

As compounds (A), there are used high molecular weight compounds, e.g., water soluble resins such as polyacrylamide and polyvinyl pyrrolidone; acrylic resins such as polyacrylic acid and polymethacrylic acid; acrylate resins such as polyacrylate and polymethacrylate; ester resins such as polyethylene terephthalate and polybutylene terephthalate; styrenic resins such as polystyrene, poly-α-methylstyrene, polychloromethylstyrene, polystyrenesulfonic acid, and polyvinyl phenol; vinylether resins such as polyvinyl methyl ether and polyvinyl ethyl ether; polyvinyl alcohols such as polyvinyl alcohol, polyvinyl formal, and polyvinyl butyral; phenolic resins such as novolak and resol; and the like.

As surface active agents (B), there are used anionic surface active agents such as alkylsulfonic acid, alkylbenzenesulfonic acid, and alkylcarboxylic acid; cationic surface active agents such as alkylamines and alkyl quaternary amines; amphotic surface active agents such as carboxypendaine and aminocarboxylic acid; nonionic surface active agents such as polyoxyethylene alkyl ether and polyoxyethylene sorbitan fatty acid ester; and fluorine-based surface active agents such as fluoroalkylcarboxylic acids, perfluoroalkyl carboxylic acids, perfluoroalkyl benzenesulfonic acids, perfluoroalkyl quaternary ammonium, and perfluoroalkyl polyoxyethylene ethanol.

The proportional amount of component (d) to be used is, as described above, within the range between 0 and 200 parts by weight, preferably between 0 and 100 parts by weight, based on 100 parts by weight of solvent (b). When the proportional amount of component (d) exceeds 200 parts by weight, the phenomena occur that the flatness of the composition becomes lowered though the coatability is improved, that the electrical conductivity of the composition becomes inferior though the flatness thereof is improved, and so forth.

The composition of the present invention preferably has a pH of 5 to 12, preferably 5 to 10. If the pH of the composition is less than 5, the polymer is precipitated in the solvent.

Since an electrical conductive film can be formed from the composition of the present invention only by spin coating and heat treatment, the processing steps for the composition are very simple. The composition is coated as a film with a thickness ranging from 0.01 to 5 μm, and the coated film is heat treated at a temperature of 250° C. or lower, preferably from 20° to 200° C., whereby an electrically conductive film is formed.

Although it is most preferable that the composition of the present invention be formed into an electrically conductive film as a layer on the resist (see FIGS. 11A, 11B and 11C), it may be used for an electrically conductive film in another place. Concretely, the electrically conductive film may be formed as an intermediate layer in a two-layer resist structure (FIG. 12), or on the intermediate layer of a three-layer resist structure (FIG. 13) or on the resist of a lower layer (FIG. 14). The present composition may be used also as a planalization layer in two-layer or three-layer resist (FIGS. 15A and 15B).

In the aforesaid FIGS. 11A to 11C, FIGS. 12 to 14, and FIGS. 15A and 15B, numeral 1 indicates an electrically conductive film, 2 a resist, 3 a substrate, 4 a silicon-containing resist, 5 a planalization layer (lower layer) and 6 an SiO$_2$ film (intermediate layer of a three-layer structure).

Figure 11A:
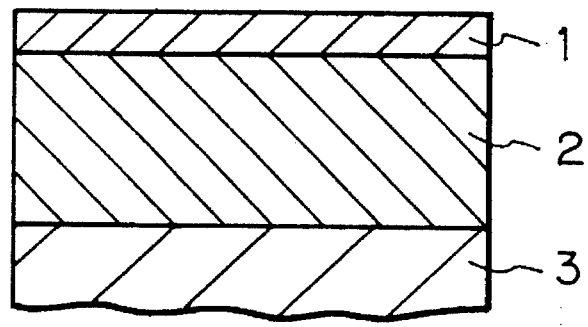
FIGS. 11A to 11C illustrate structural views in the cases where a conductive film has been formed as the uppermost layer of (a) a monolayer resist, (b) two-layer resist, and (c) three-layer resist, respectively.
Figure 11B:
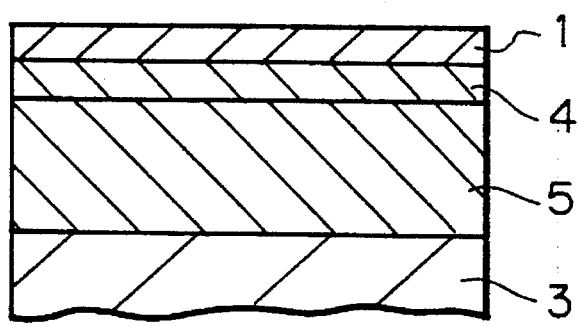
Figure 11C:
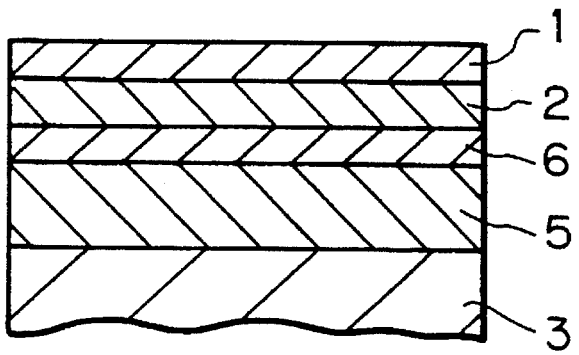
Figure 12:
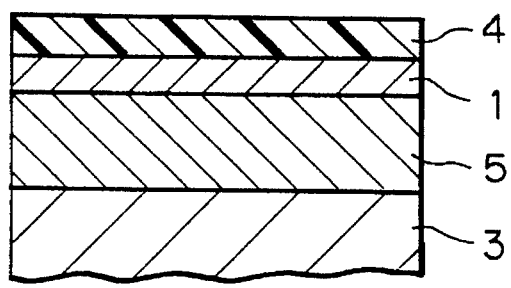
FIG. 12 illustrates a structural view in the case where a conductive film has been formed as an intermediate layer in a two-layer resist.
Figure 13:
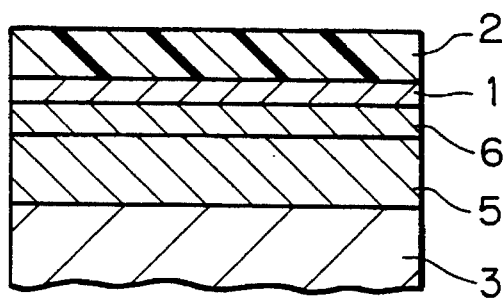
FIG. 13 illustrates a structural view in the case where a conductive film has been formed on the intermediate layer in a three-layer resist.
Figure 14:
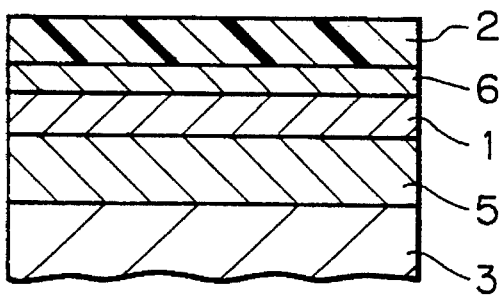
FIG. 14 illustrates a structural view in the case where a conductive film has been formed below the intermediate layer in a three-layer resist.

The composition of the present invention contrives to prevent resist 2 from being electrostatically charged according to the structure illustrated in FIG. 11A, to prevent, e.g., silicon-containing resist 4 and planalization layer 5 from being electrostatically charged according to the structure illustrated in FIG. 11B, to prevent resist 2, e.g., SiO$_2$ film 6 and planalization layer 5 from being electrostatically charged according to the structure illustrated in FIG. 11C, to prevent mainly the planalization layer 5 from being electrostatically charged according to the structure illustrated in FIG. 12, to prevent mainly the SiO$_2$ film 6 and planalization layer 5 from being electrostatically charged according to the structure illustrated in FIG. 13, and to prevent mainly the planalization layer 5 from being electrostatically charged according to the structure illustrated in FIG. 14.

Figure 15A:
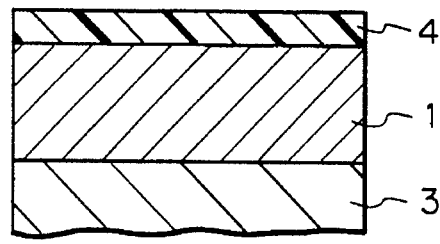
FIGS. 15A and 15B illustrate structural views in the cases where a conductive film has been formed as a flattened layer (the lowest layer) of (a) a two-layer resist and of (b) a three-layer resist, respectively.
Figure 15B:
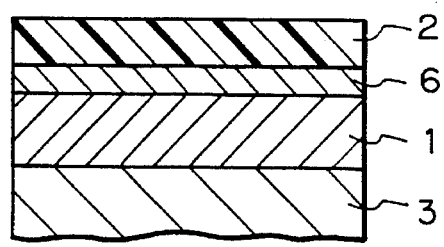

In addition, the embodiments illustrated in FIG. 15A and FIG. 15B show examples in which a blend obtained by blending a resist with the present composition is coated so as to be used as a planalization layer (lower layer), and in this example, it is contrived to prevent the blended resist itself from being electrostatically charged.

The substrates to which the present process for the formation of a pattern may be applied are silicon (Si) semiconductors, gallium-arsenic (GaAs) substrates, mask substrates or the like. As a resist, any kind of resist may be used without reference to negative or positive type, by selecting the kind of a solvent for the composition of the present invention such that the solvent does not form a mixed layer with the resist, so long as the resist is sensitive to an electron beam and/or ion beam. As a monolayer resist and an upper layer resist of a three-layer resist structure, there are preferably used resists consisting essentially of a polymer such as novolak type, acrylamide type, styrenic, methacrylate type polymers or the like, and as an upper layer resist of a two-layer resist structure, there is preferably used a silicone-based resist. As an intermediate layer resist of a three-layer resist structure, there is preferably used a silicone-based polymer, and as a lower layer resist of a two-layer or three-layer resist structure, there is preferably used a novolak type or styrenic polymer.

Formation of a resist film in the process of the present invention is conducted, e.g., by coating a resist on a substrate by spin coating and prebaking it.

Formation of a conductive film in the process of the present invention is conducted by coating the composition of the present invention, e.g., on the previously obtained resist film, e.g., by the spin coating and prebaking it.

Although irradiation or scanning by an electron beam (EB) is typical as the irradiation of a charged beam in the process of the present invention, an irradiating system by use of an ion beam or the like is also available.

As an exposure device to be used, there are preferably used the ones having a structure in which an electrically conductive film communicates with the outside.

Removing of the conductive film can be conducted by use of water, hydrous organic solvent or other organic solvent containing (c) amines and/or quaternary ammonium salts. In the case of a resist to be developed, since the present conductive film is soluble in a developing solution, it is possible to simultaneously conduct development and removing.

When the composition for pattern formation and the process for the formation of a pattern of the present invention are applied in electron beam lithography or focusing ion beam lithography, the electric charge accumulation in the resist during the electron beam or focusing ion beam exposure is prevented or shielded by the ground potential owing to the high electrical conductivity of the layer formed from the present composition. Accordingly, the electric charges do not interact with each other during the exposure, and misregistration, dimensional error or the like of the pattern can be completely prevented. In addition, according to the present invention, a layer of the composition can be formed by spin coating of the composition by use of an aqueous and/or organic solvent. Accordingly, there may be used, as the coating solvent, e.g., one that does not form a mixed layer with the resist, and therefore, charge-up phenomenon can be prevented without giving adverse effect to the properties of the resist. In addition, removing of the formed electrically conductive film is conducted in water and/or an organic solvent, and the removing step is very simple. Further, since the composition may be used within the pH value range between 5 and 12, it can be used for general and unspecified uses.

In the following, the present invention will be explained more in detail with reference to the working examples, but it is needless to say that the present invention is not limited to these working examples.

EXAMPLES

Example 1

10 parts by weight of phenylene diamine and 19 parts by weight of p-aminobenzenesulfonic acid were polymerized with ammonium persulfate $(NH_4)_2 S_2O_8$ under acid conditions attributed to hydrochloric acid, so that a copolymer was synthesized. The thus synthesized copolymer was further sulfonated with 1000 parts by weight of concentrated sulfuric acid, so as to synthesize a sulfonated polyaniline. With respect to the thus synthesized compound, there were observed absorptions peculiar to sulfonated polyaniline in IR spectra (FIG. 1, around 1500 $cm^{-1}$: the skelton of the sulfonated polyaniline, around 1100 $cm^{-1}$: the absorption of the sulfonic group). In addition, the sulfonic group content of the obtained sulfonated polyaniline was found to be 54%. This sulfonated polyaniline had a weight average molecular weight of 26,000 and a molecular weight dispersion of 2.2.

2.0 parts by weight of the aforesaid sulfonated polyaniline, 0.3 part by weight of ammonia, and 0.5 part by weight of ammonium carbonate were dissolved in 50 parts by weight of water and 50 parts by weight of isopropanol (IPA), following which the obtained solution was filtered, so as to prepare a conductive composition for pattern formation.

By use of the thus obtained solution, a pattern was formed by the process described in the following (see FIGS. 16A to 16E).

Figure 16A:
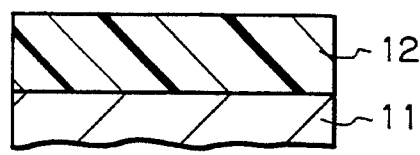
FIGS. 16A to 16E illustrate a flowchart, in which a conductive film is coated on a resist, so as to form a pattern.
Figure 16B:
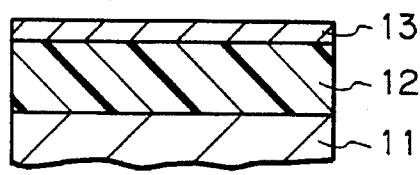
Figure 16C:
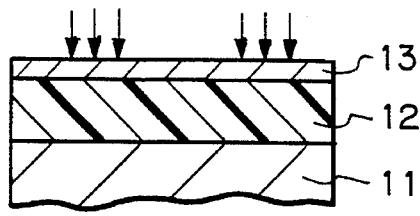
Figure 16D:
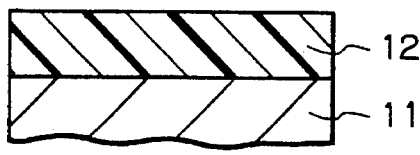
Figure 16E:
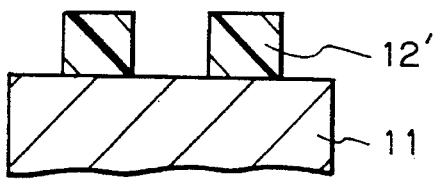

On a GaAs substrate 11, there was coated a PMMA resist with a film thickness of 2.0 μm by the spin coating method, so as to form a resist film 12, which was prebaked on a hot plate for 100 seconds at a temperature of 80° C. (FIG. 16A). Subsequently, the composition for pattern formation was spin coated with a film thickness of 0.05 μm on the resist, so that an electrically conductive film 13 was formed, and prebaked on a hot plate for 100 seconds at a temperature of 100° C. (FIG. 16C). Subsequently, the thus coated composition was exposed to an electron beam at an acceleration voltage of 30 kV and an exposure dose of 50 μC/$cm^2$ (FIG. 16C). Subsequently, the electrically conductive film was removed with a 0.1N ammonia-ethanol solution by use of a spin developer (FIG. 16D), rinsed with isopropanol (IPA), then developed with a solution mixture of methylisobutylketone (MIBK)/IPA=1/1, and rinsed with IPA, so that a resist pattern 12' was obtained (FIG. 16E).

Figure 5A:
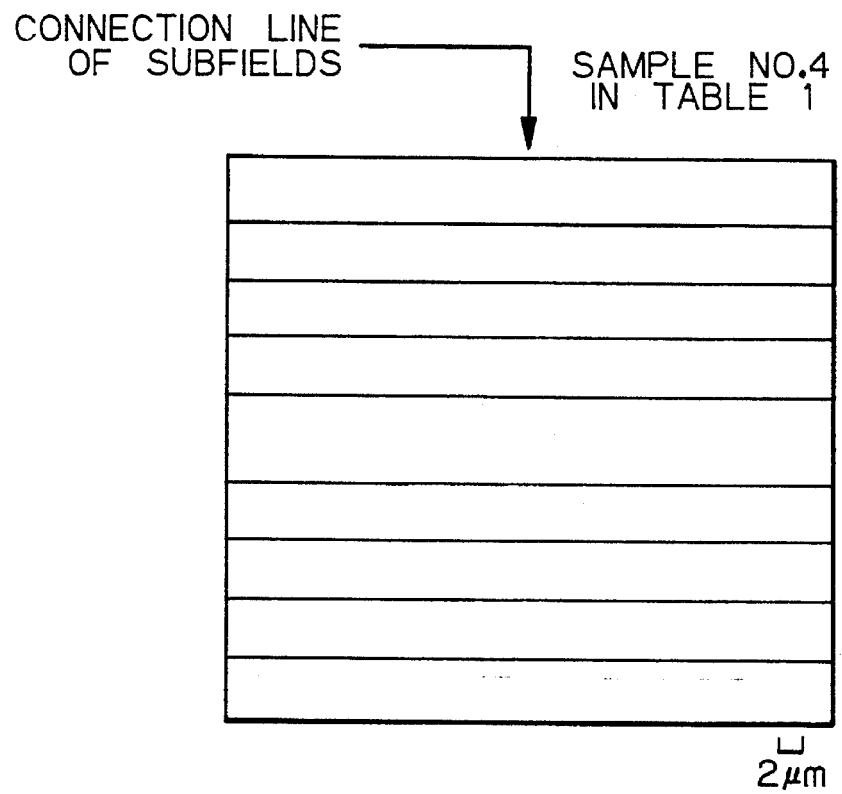
FIGS. 5A and 5B illustrate a typical view showing the pattern obtained by coating the conductive compositions for pattern formation in the present invention (FIG. 5A is the material of No. 4 in Table 1, and FIG. 5B is the material of No. 6 in Table 1), so as to form patterns.
Figure 5B:
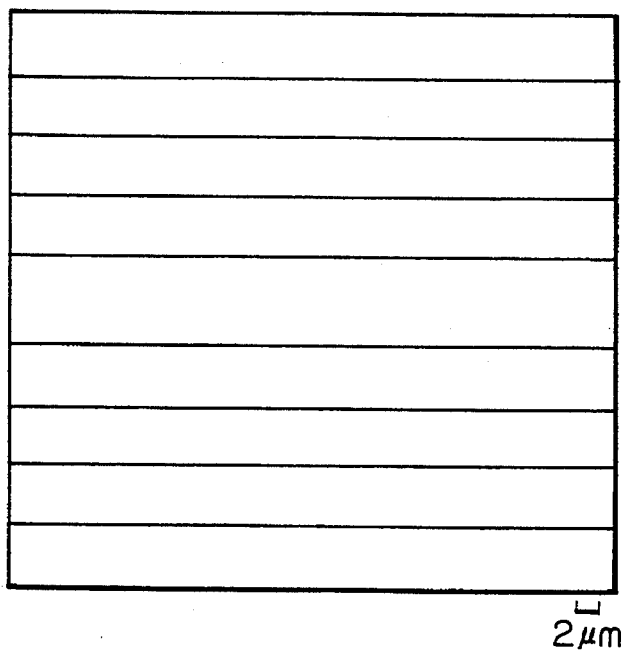

The thus obtained pattern is illustrated in FIG. 5B. As clearly seen from FIG. 5B, there is not observed any misregistration of pattern at a joint of fields, there is no pattern deformation by coating the present composition for pattern formation, and isolated line patterns with widths of 0.8 μm and 1.0 μm are clearly resolved.

Figure 7A:
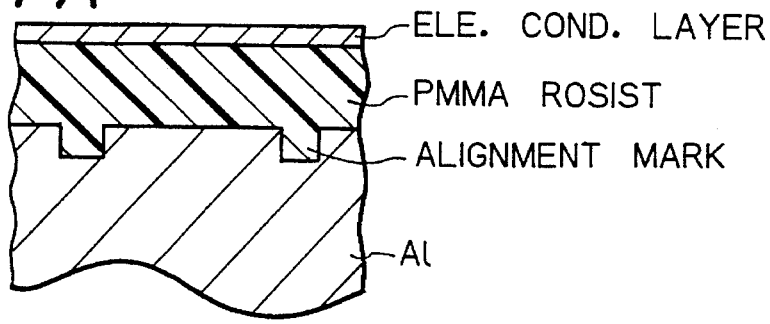
FIGS. 7A to 7D illustrate a flowchart showing the procedures for the evaluation of charge-up.
Figure 7B:
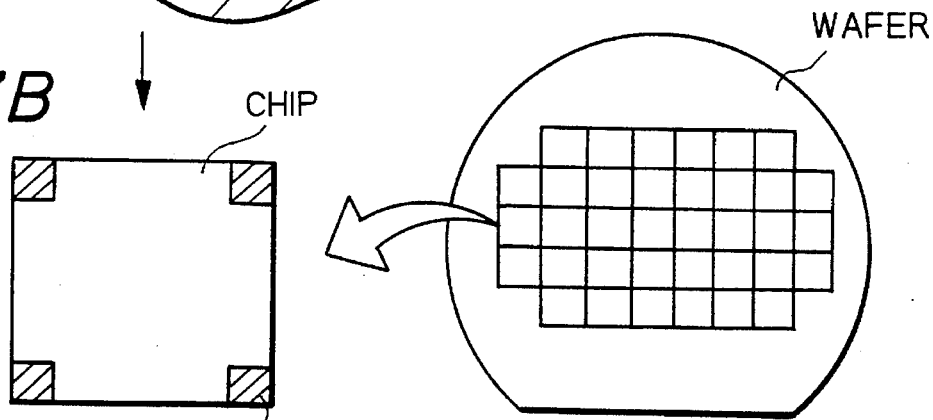
Figure 7C:
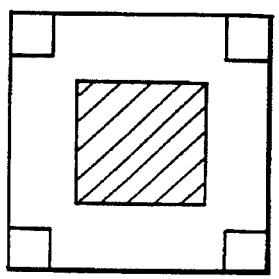
Figure 7D:
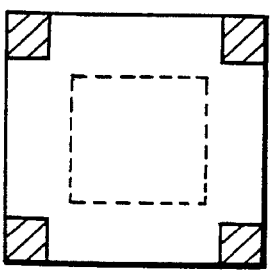
Figure 8B:
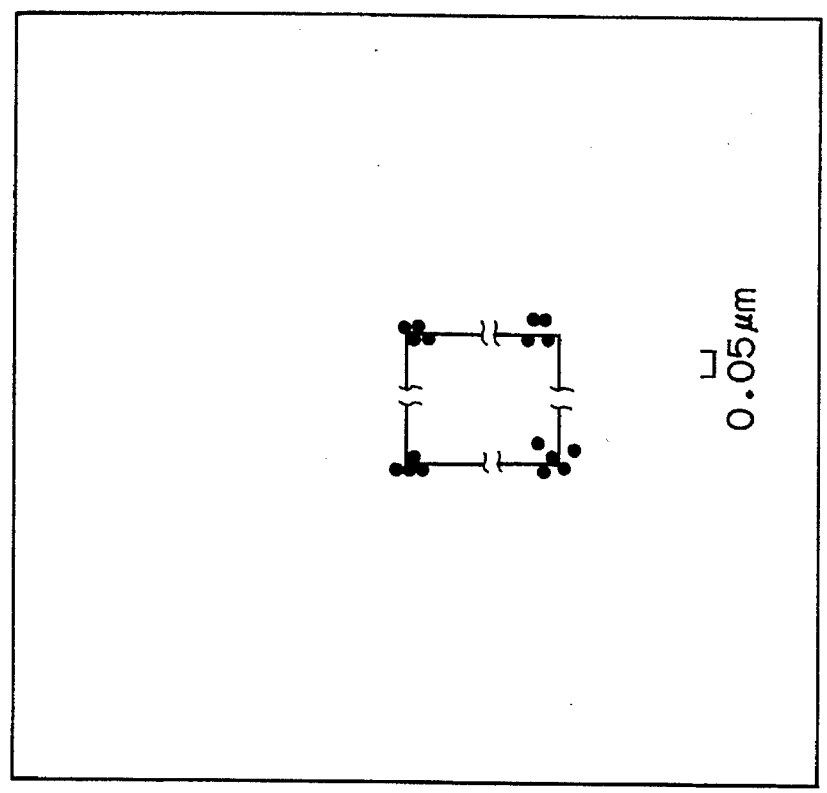
FIGS. 8A and 8B illustrate graphs showing the evaluation results of charge-ups with respect to the samples coated with conductive films (FIG. 8A is the material of No. 4 in Table 1, and FIG. 8B is the material of No. 6 in Table 1).
Figure 8A:
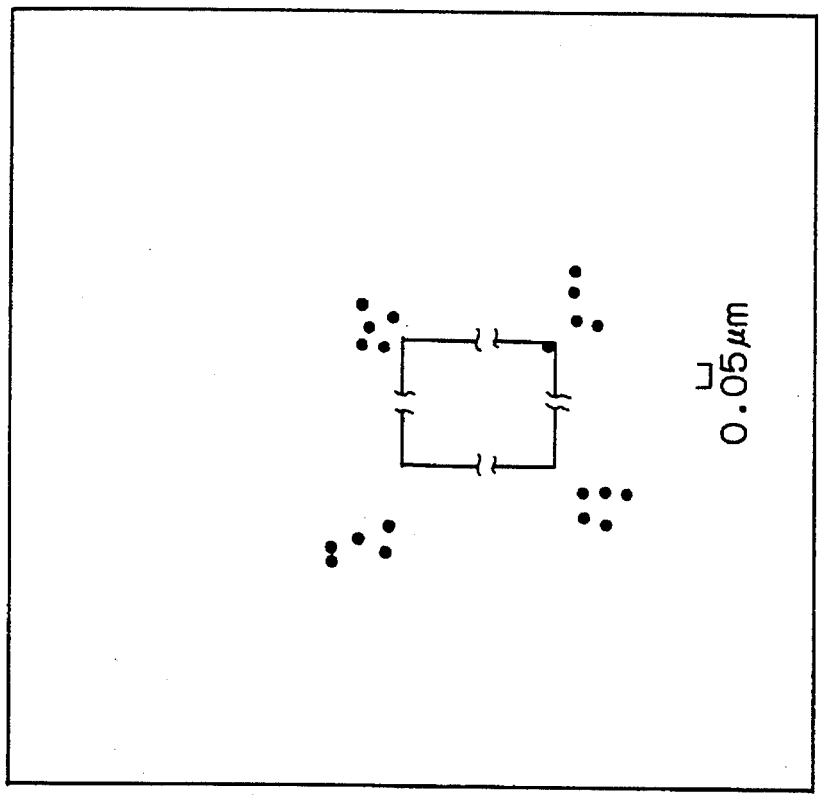

Next, a charge-up prevention effect was evaluated in the way as described in the following (see FIGS. 7A to 7D). On an Al-Si substrate wafer having many chips (the size of each chip: 9.5 mm×9.5 mm), at each of the 4 corners of which an alignment mark different in level is disposed, there was coated a PMMA resist to a thickness of 2.0 μm, and the coated resist was baked on a hot plate of 80° C. for 100 seconds, following which the composition for pattern formation was coated to a thickness of 0.05 μm on the resist and baked on a hot plate of 100° C. for 100 seconds (FIG. 7A). Then, the alignment marks on the 4 corners of the arrangement of chips placed on the wafer were detected by an electron beam exposure apparatus (FIG. 7B). Subsequently, 20% of the area in the chips were exposed at an acceleration voltage of 30 kV and a dose of 50 μC/$cm^2$ (FIG. 7C), the marks at the 4 corners were again detected, and misregistration degree was determined by comparison of the thus detected value with the value detected before the exposure (FIG. 7D). Evaluation was conducted with respect to 5 chips for each wafer. As a result, no misregistration was recognized as illustrated in FIG. 8B.

Comparative Example 1

Figure 6:
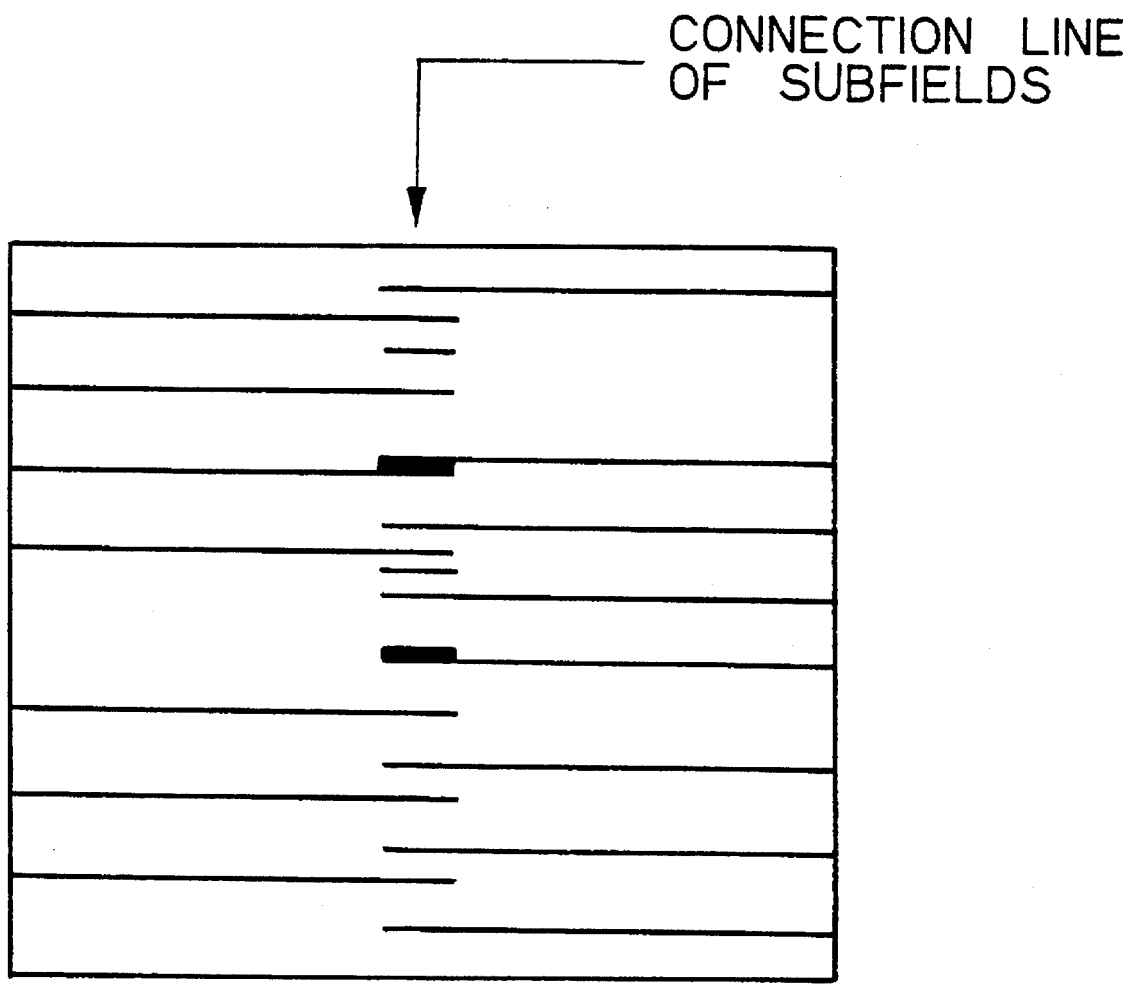
FIG. 6 illustrates a typical view showing a pattern obtained by the conventional pattern formation method without coating a conductive film.

On a GaAs substrate, there was coated a PMMA resist with a thickness of 2.0 μm by spin coating, and the resist was prebaked on a hot plate for 100 seconds at a temperature of 80° C. Subsequently, the resist was exposed to electron beam scanning at an acceleration voltage of 30 kV and a dose of 50 μC/$cm^2$, whereafter the resist was developed with a solution mixture of methylisobutylketone (MIBK)/IPA=1/1, and subjected to rinsing treatment with IPA. The developed resist was post-baked on a hot plate at 110° C. for 100 seconds, and the formed pattern was observed by SEM, so that there were observed misregistrations of the pattern at junctions of the fields (isolated lines with widths of 0.8 μm and 1.0 μm as shown in FIG. 6).

Figure 9:
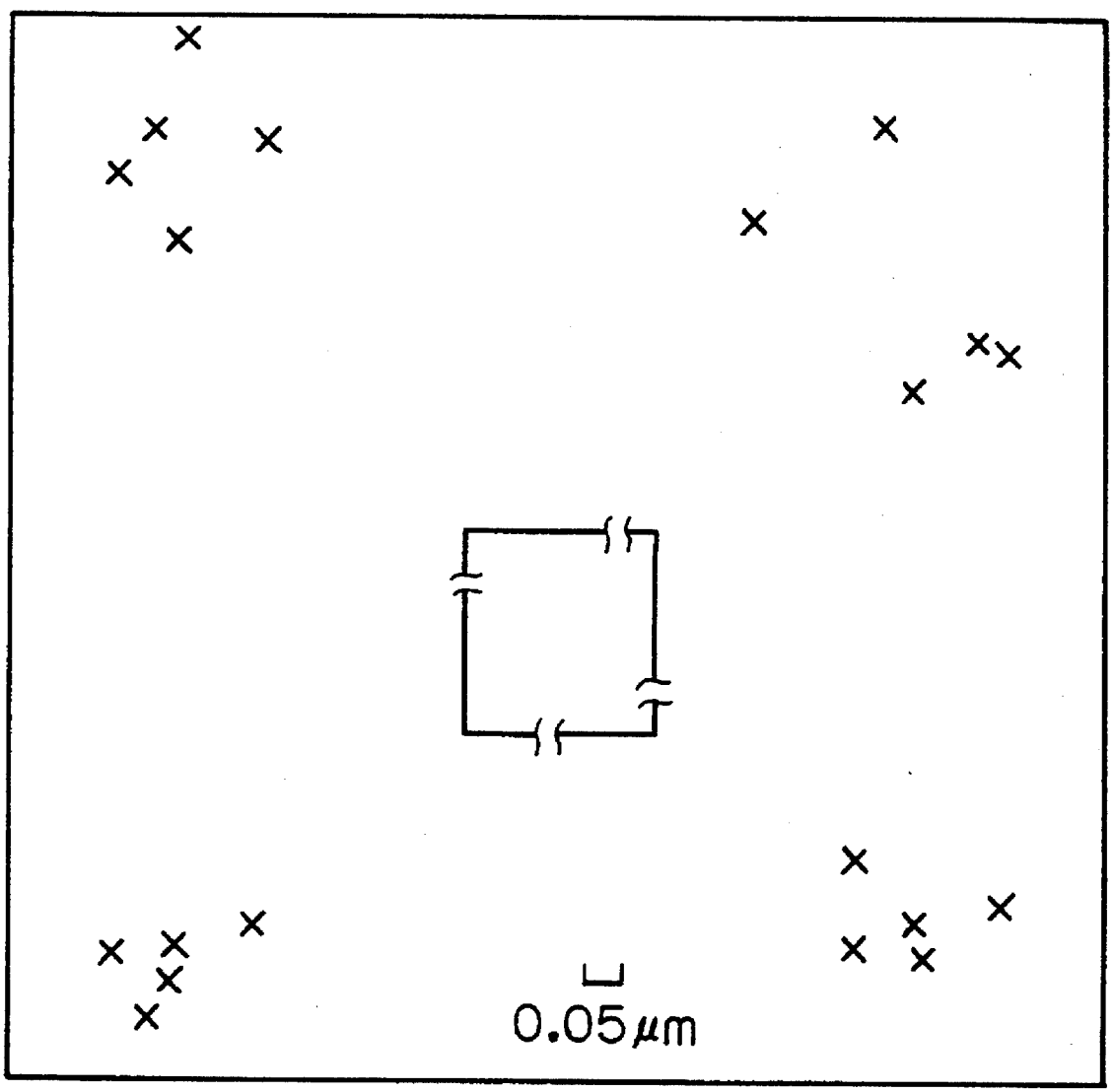
FIG. 9 illustrates the results of charge-up regarding the sample which has not been coated with the conductive film.

In addition, with respect to this sample, the detected positions of stepped marks before and after exposure were compared with each other, in the same way as described in Example 1, so that there was observed a misregistration of 0.6 μm, as illustrated in FIG. 9.

Example 2

Figure 2:
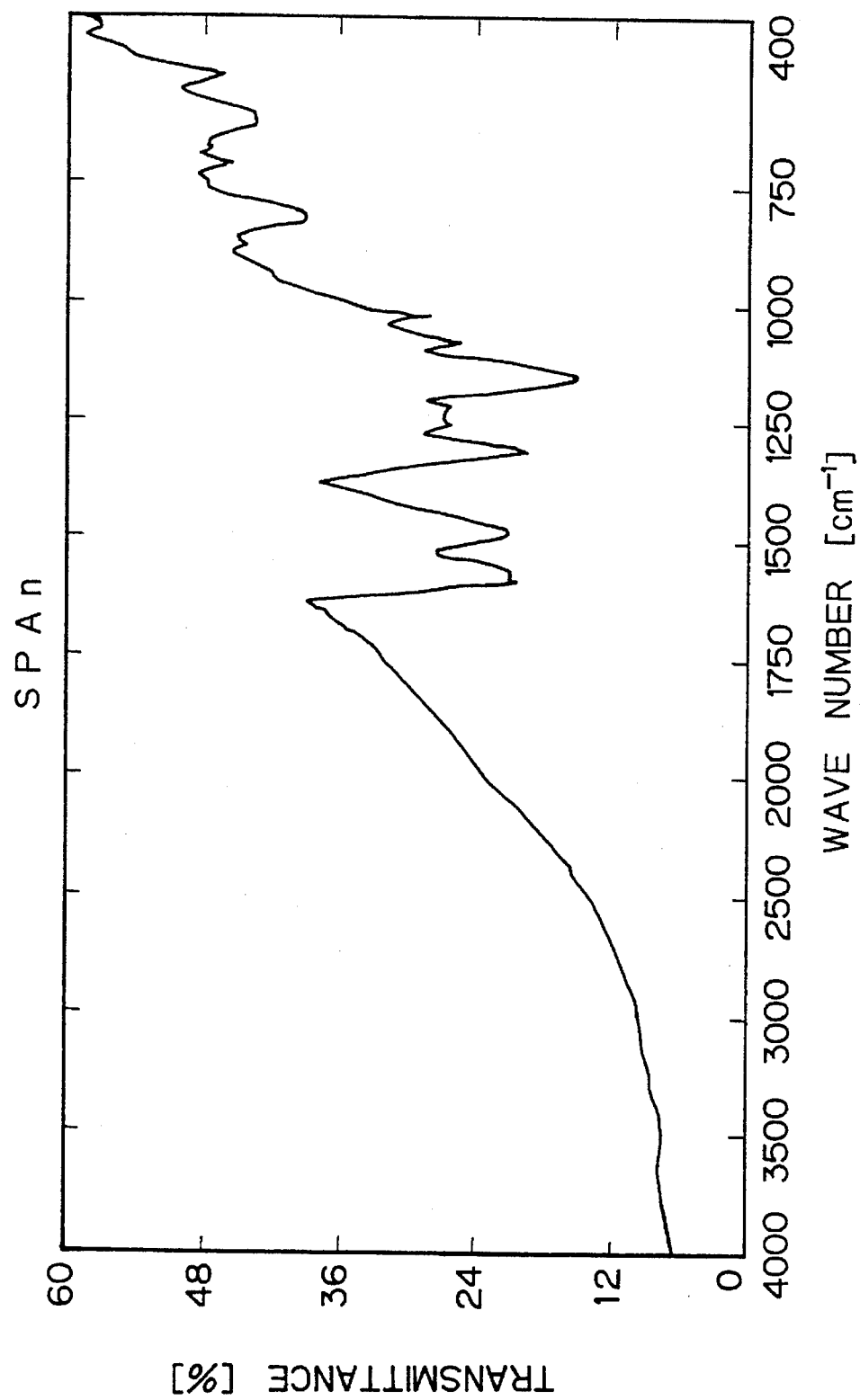
FIG. 2 is the IR spectra of the sulfonated polyaniline synthesized in Example 2, obtained by the KBr tablet method.

10 parts by weight of aniline and 18 parts by weight of m-aminobenzenesulfonic acid were polymerized with ammonium persulfate under acid conditions attributed to hydrochloric acid, so that a copolymer was synthesized. The thus synthesized copolymer was further sulfonated with 640 parts by weight of fuming sulfuric acid, so as to synthesize a sulfonated polyaniline. With respect to the thus synthesized compound, there were observed absorptions peculiar to sulfonated polyaniline in IR spectra (FIG. 2, around 1500 $cm^{-1}$: the skelton of the sulfonated polyaniline, around 1100 $cm^{-1}$: the absorption of the sulfonic group). This sulfonated polyaniline was a compound with a sulfonation rate of 48%. This sulfonated polyaniline had a weight average molecular weight of 35,000 and a molecular weight dispersion of 2.1.

2.0 parts by weight of the aforesaid sulfonated polyaniline and 0.3 part by weight of ammonia were dissolved in 100 parts by weight of a solution mixture of water/ethanol (1/1), following which the obtained solution was filtered, so as to prepare a composition for pattern formation.

By use of the thus obtained solution, a pattern was formed by the following process.

On a Si substrate, there was coated a CMR positive type resist with a film thickness of 2.0 μm (T. Kitakohji, Y. Yoneda, and K. Kitamura, J. Electrochem. Soc., 1979, 126 (11), 1881), and prebaking was conducted on a hot plate for 100 seconds at a temperature of 180° C. Subsequently, the previously prepared composition for pattern formation was spin coated to a film thickness of 0.05 μm on the CMR resist, and prebaked on a hot plate for 100 seconds at a temperature of 100° C. Subsequently, the thus coated composition was exposed to scanning of an electron beam at an acceleration voltage of 30 kV and a dose of 50 μC/cm², whereafter the conductive film was peeled with a 0.1N ammonia-methanol solution by use of a spin developer, rinsed with isopropanol (IPA), and thereafter developed with a solution mixture of methylisobutylketone (MIBK)/IPA=1/1, following which the film was rinsed with IPA.

A charge-up prevention effect was examined in the same way as described in Example 1. As a result, it was found that misregistration of a pattern had been completely prevented.

Figure 10A:
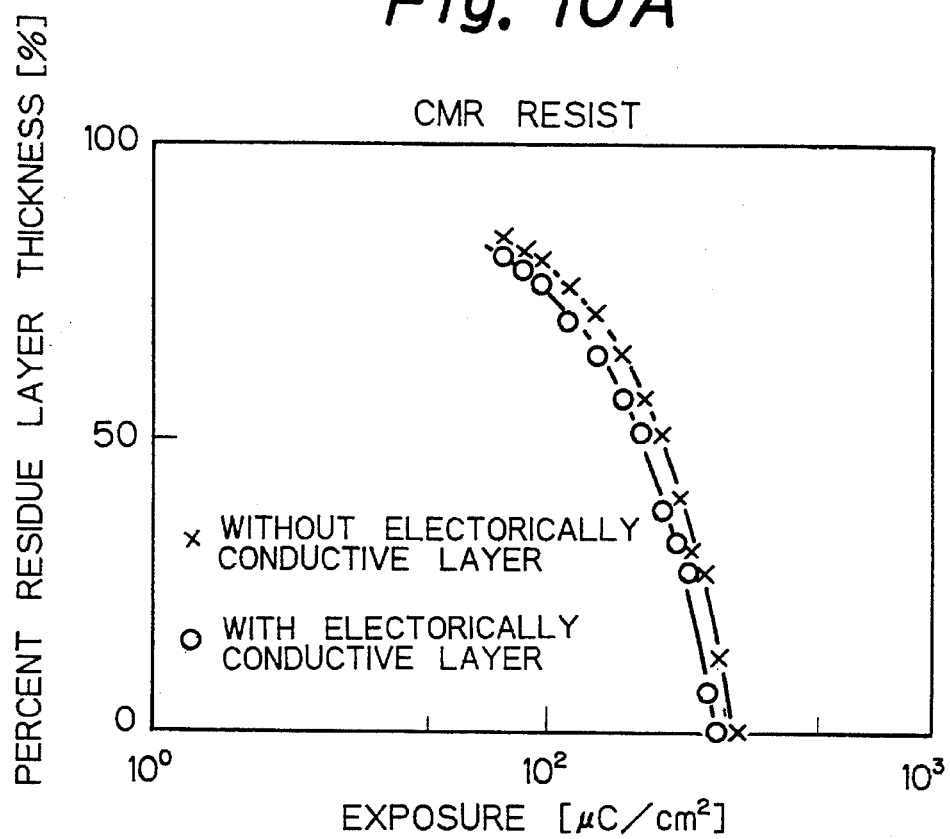
FIGS. 10A and 10B illustrate the graphs showing the sensitivity curves of (a) CMR resist and (b) SAL 601 resist, in the cases where the respective resist has been coated with a conductive film and where the respective resist has not been coated with the conductive film.

Next, the sensitivity curves in the cases where the composition for pattern formation in the present invention was used and where it was not used are illustrated in FIG. 10A. As can be clearly seen in FIG. 10A, there was scarcely recognized a difference between these cases. Accordingly, it can be understood that the present composition has little influence on the sensitivity characteristic of the resist.

Example 3

Figure 3:
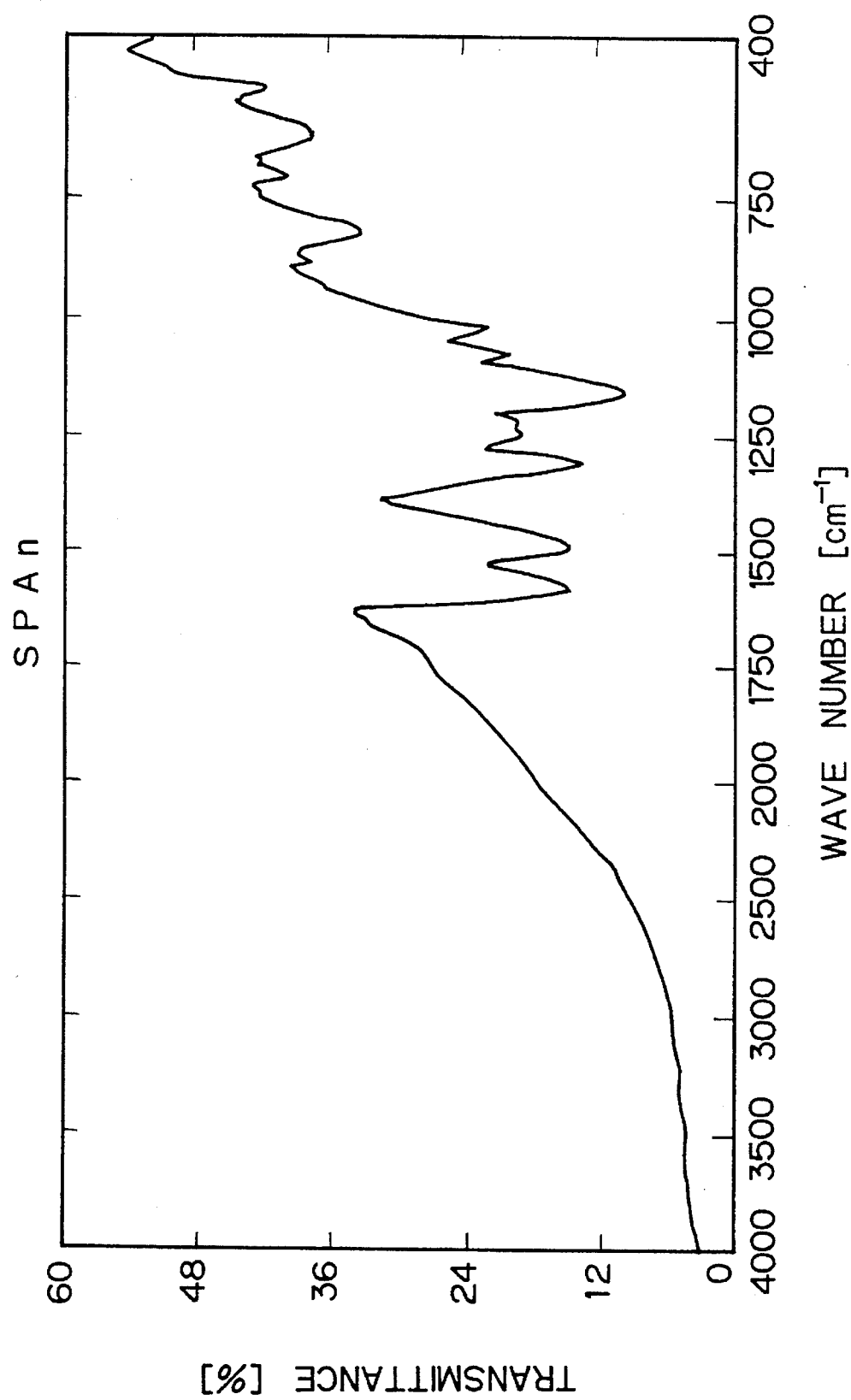
FIG. 3 is the IR spectra of the sulfonated polyaniline synthesized in Example 3, obtained by the KBr tablet method.

10 parts by weight of phenylenediamine, 1.3 part by weight of N-methylaniline, and 19 parts by weight of p-aminobenzenesulfonic acid were polymerized with ammonium persulfate under acid conditions attributed to hydrochloric acid, so that a copolymer was synthesized. The thus synthesized copolymer was further sulfonated with 1000 parts by weight of concentrated sulfuric acid, so as to synthesize a sulfonated polyaniline. With respect to the thus synthesized compound, there were observed absorptions peculiar to sulfonated polyaniline in IR spectra (FIG. 3, around 1500 cm$^{-1}$: the skeleton of the sulfonated polyaniline, around 1100 cm$^{-1}$: the absorption of the sulfonic group). The sulfonation rate of the obtained sulfonated polyaniline was found to be 49%. This sulfonated polyaniline had a weight average molecular weight of 54,000 and a molecular weight dispersion of 1.3.

3 parts by weight of the aforesaid sulfonated polyaniline, 1.2 part by weight of trimethylamine and 0.01 part by weight of ammonium perfluoroalkyl benzenesulfonate were dissolved in 100 part by weight of water, following which the obtained aqueous solution was filtered, to prepare a composition for pattern formation.

By use of the thus obtained aqueous solution, a pattern was formed by the following process.

On a Si substrate, there was coated an OFPR positive type resist with a film thickness of 2.0 μm by the spin coating method, and the coated resist was prebaked on a hot plate for 100 seconds at a temperature of 80° C. Subsequently, the previously prepared composition for pattern formation was spin coated to a film thickness of 0.1 μm on the resist, and prebaked on a hot plate for 100 seconds at a temperature of 100° C. Subsequently, the thus coated composition was exposed to scanning of an electron beam at an acceleration voltage of 30 kV and a dose of 50 μC/cm², whereafter development was conducted with a 0.2N aqueous solution of tetramethylammonium hydroxide (TMAH) by use of a spin developer. In the case of this development, the present conductive film was removed together with the resist.

A charge-up prevention effect was examined in the same way as described in Example 1. As a result, it was found that misregistration of a pattern had been completely prevented, and there was recognized no adverse effect on the sensitivity and resolution power of the resist even by the use of the composition for pattern formation of the present working example.

Example 4

Figure 4:
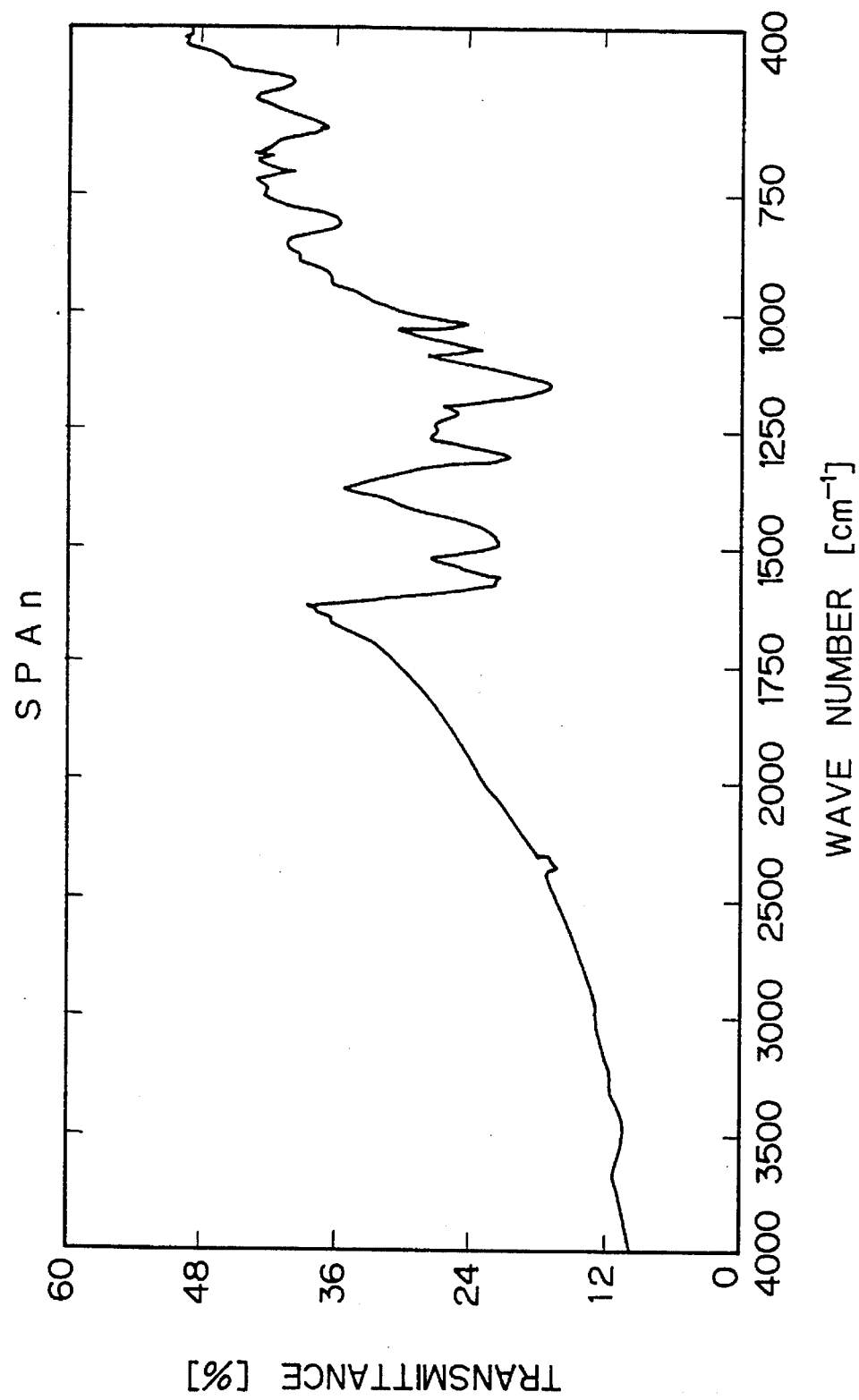
FIG. 4 is the IR spectra of the sulfonated polyaniline synthesized in Example 4, obtained by the KBr tablet method.

10 parts by weight of aniline, 1.3 part by weight of N-methylaniline, and 20 parts by weight of m-aminobenzenesulfonic acid were polymerized with ammonium persulfate under acid conditions attributed to hydrochloric acid, so that a copolymer was synthesized. The thus synthesized copolymer was further sulfonated with 700 parts by weight of fuming sulfuric acid, so as to synthesize a sulfonated polyaniline. With respect to the thus synthesized compound, there were observed absorptions peculiar to sulfonated polyaniline in IR spectra (FIG. 4, around 1500 cm$^{-1}$: the skeleton of the sulfonated polyaniline, around 1100 cm$^{-1}$: the absorption of the sulfonic group). The sulfonation rate of the obtained sulfonated polyaniline was found to be 47%. This sulfonated polyaniline had a weight average molecular weight of 83,000 and a molecular weight dispersion of 1.8.

5 parts by weight of the aforesaid sulfonated polyaniline, 0.6 part by weight of ammonia and 0.2 part by weight of dodecylsulfonic acid were dissolved in 100 parts by weight of water, following which the obtained aqueous solution was filtered, to prepare a composition for pattern formation.

By use of the thus obtained aqueous solution, a pattern was formed by the following process.

On a Si substrate, there was coated an SAL-601 negative type chemical amplification resist with a film thickness of 2.0 μm (produced by Sipley Inc.) by the spin coating method, and the coated resist was prebaked on a hot plate for 100 seconds at a temperature of 80° C. Subsequently, the previously prepared conductive composition for pattern formation was spin coated to a film thickness of 0.15 μm on the resist, and prebaked on a hot plate for 100 seconds at a temperature of 100° C. Subsequently, the thus coated composition was exposed to an electron beam at an acceleration voltage of 30 kV and a dose of 50 μC/cm². After post exposed baking (PEB) had been conducted for 100 seconds at a temperature of 100° C., the film of the conductive composition was developed with 2.38% by weight of an aqueous solution of TMAH by use of a spin developer, and rinsed with pure water. In the case of this development, the present conductive film was removed together with the resist.

Figure 10B:
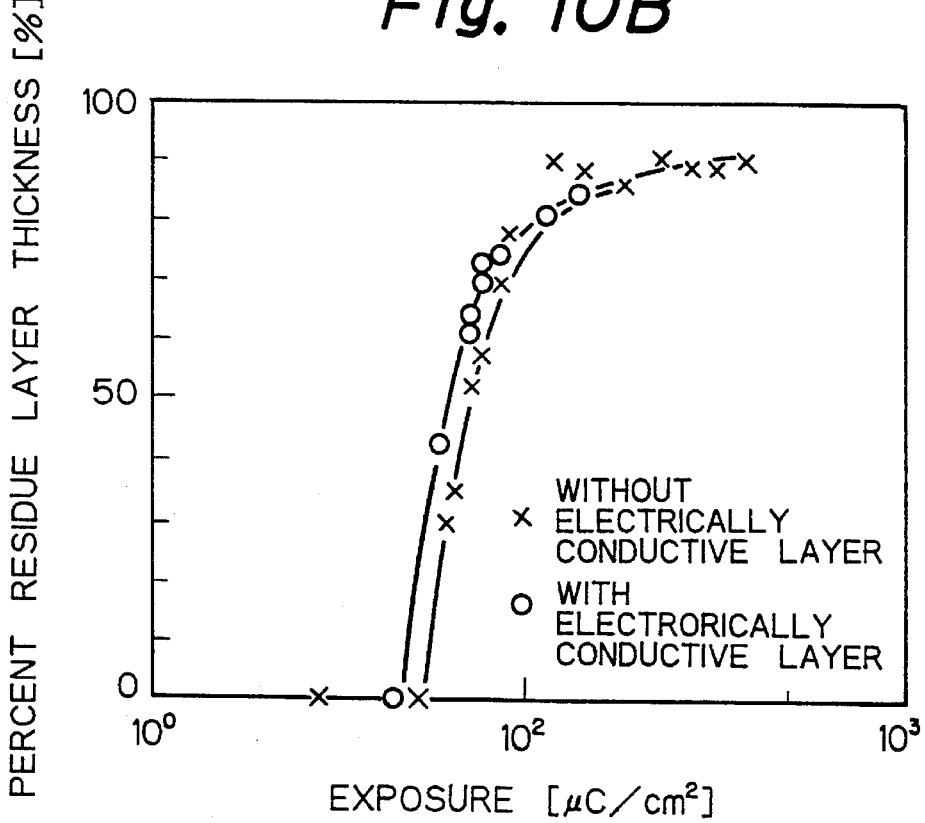

A charge-up prevention effect was examined in the same way as described in Example 1. As a result, it was found that misregistration of a pattern had been completely prevented. The sensitivity curves of SAL-601 resist in the cases where the conductive material for pattern formation in the present invention was used and where it was not used are illustrated in FIG. 10B. As may clearly been seen from FIG. 10B, there is little difference between both cases, and it has been confirmed that the present conductive composition does not have any adverse effect on the sensitivity of the SAL-601 resist. In addition, there was recognized no adverse effect on the resolution.

Example 5

With respect to the sulfonated polyaniline synthesized in Example 1, there were compared the influences on the conductivities (the surface electrical resistances of the film) and coatabilities (coating irregularity) by the solvents, amines/ammonium salts, high molecular weight compounds and surface active agents (see Table 1).

TABLE 1

| Sample No. | Sulfonation Rate | Solvent | Base | Polymer | Additive | Surface Electrical Resistance (Ω/□) | Application Irregularity |
|---|---|---|---|---|---|---|---|
| 1 | 20% (2) | water (100) | $NH_3$ (0.3) | — | — | 5.6E10 | good |
| 2 | 54% (2) | water (100) | $NH_3$ (0.3) | — | — | 1.2E9 | good |
| 3 | 54% (2) | water (100) | $NH_3$ (0.3) | PA (1.0) | — | 5.2E8 | excellent |
| 4 | 54% (2) | water (100) | $NH_3$ (0.3) | — | DS (0.2) | 2.8E8 | excellent |
| 5 | 54% (2) | water/IPA (50/50) | $NH_3$ (0.3) | — | — | 3.2E7 | excellent |
| 6 | 54% (2) | water/IPA (50/50) | $NH_3$/AC (0.2/0.5) | — | — | 4.0E6 | excellent |

1) Surface electrical resistance: measured with respect to the films coated at a rotating speed of 2000 rpm.
2) Coating irregularity: the case where the conductive composition was coated on a CMR resist.
3) Abbreviations: DS = dodecylsulfonic acid   AC = ammonium carbonate
4) Sample No. 1 is a sulfonated polyaniline with a sulfonic group content of 20%. (A great quantity of insolubles is recognized.)

It can be seen from Table 1 that by increasing the sulfonation rate of the sulfonated polyaniline from 20 to 54%, the surface electrical resistance thereof is taken a figure or order of magnitude down. In addition, by (1) mixing a polymer, (2) mixing an additive, (3) using a mixture of amine/ammonium carbonate as a base, or (4) using a mixture of water/alcohol as a solvent, the surface electrical resistance can be taken 1 to 3 figures or orders of magnitudes down.

By use of sulfonated polyanilines, the conductivities of which have been improved by these methods, the effects given to misregistration preventing effects attributable to the difference between surface electrical resistances are illustrated in FIGS. 5A–5B and FIGS. 8A–8B. Even in a conductive composition of No. 4 with a surface electrical resistance in the order of $10^8 \Omega/\square$, a misregistration-preventing effect is confirmed, and in a conductive composition of No. 6 with a surface electrical resistance in the order of $10^6 \Omega/\square$, in which the solvent (water/IPA=50/50) and base $NH_3/(NH_4)_2CO_3=0.2/0.5$ were particularly selected, it can be seen that misregistration can be completely prevented.

Example 6

Figure 17A:
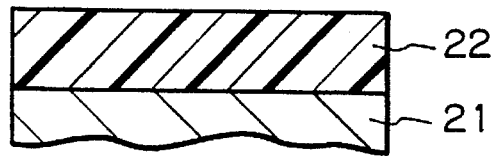
FIGS. 17A to 17G illustrate a flowchart, in which a conductive film is coated on a two-layer resist, so as to form a pattern.
Figure 17B:
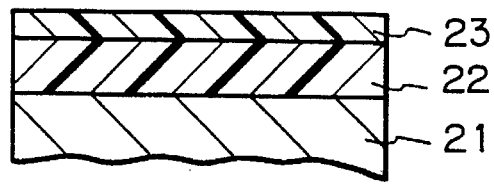
Figure 17C:
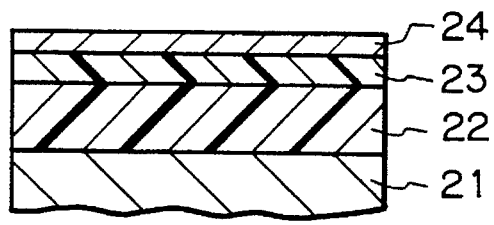

On a silicon substrate 21, there was spin coated an OFPR 800 photoresist (produced by Tokyo Oka Inc.) to a thickness of 1.0 μm, so as to form a planalization layer (lower layer) 22, which was subsequently hard baked for 5 minutes at a temperature of 200° C. (FIG. 17A). On the thus baked layer, there was spin coated a silicon-containing resist, Z-SEN (produced by Nippon Zeon Inc.) to a thickness of 0.2 μm, so as to form a resist layer 23, and the prebaking thereof was conducted for 90 seconds at a temperature of 80° C. (FIG. 17B). On the thus prebaked resist layer, there was spin coated the composition used in Example 1 to a film thickness of 0.15 μm, so as to obtain a conductive film 24, which was then prebaked for 100 seconds at a temperature of 100° C. (FIG. 17C).

Figure 17D:
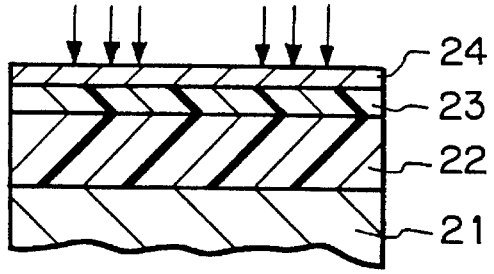
Figure 17E:
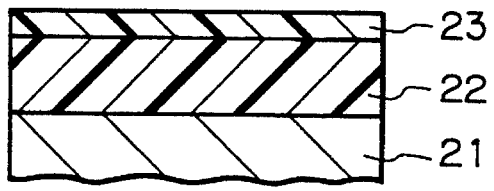
Figure 17F:
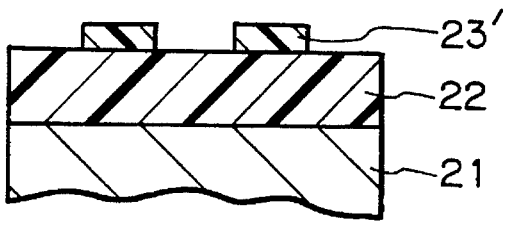
Figure 17G:
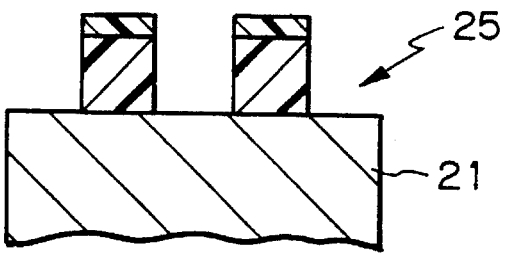

Subsequently, after scanning of an electron beam had been conducted at an acceleration voltage of 30 kV and a dose of 20 μC/cm² (FIG. 17D), the conductive film was removed with a 0.1N ammonium methanol solution by use of a spin developer (FIG. 17E), rinsed with IPA, whereafter the silicone-containing resist, Z-SEN, was developed with MIBK and rinsed with IPA, so as to obtain an upper layer resist pattern 23' (FIG. 17F). After the obtained resist pattern had been after-baked for 90 seconds at a temperature of 80° C., by use of a parallel plate type reactive ion etching apparatus, the upper layer resist pattern 23' was transferred to the lower layer, under an oxygen gas pressure of 2.6 Pa, at an applied frequency of 13.56 MHz, oxygen gas flow rate of 20 sccm, and applied power density of 0.16 W/cm², so that a resist pattern 25 was obtained.

Charge-up prevention effect was examined in the same way as described in Example 1. As a result, it was found that the pattern had been completely prevented from being misregistered. In addition, no adverse effect was recognized to have been given to the sensitivity and resolution of the resist even by the use of the composition for pattern formation of the present working example.

Example 7

Figure 18A:
FIGS. 18A to 18I illustrate a flowchart, in which a conductive film is coated on a three-layer resist, so as to form a pattern.
Figure 18B:
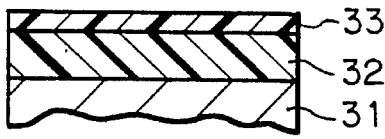
Figure 18C:
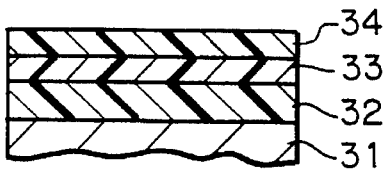
Figure 18D:
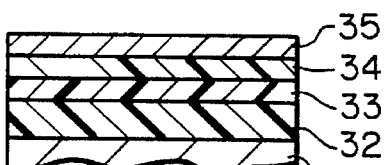

On a silicon substrate 31, there was spin coated an OFPR 800 photoresist (produced by Tokyo Oka Inc.) to a thickness of 1.0 μm, so as to form a planalization layer (lower layer) 32, which was subsequently hard baked for 5 minutes at a temperature of 200° C. (FIG. 18A). On the thus baked layer, there was spin coated a silicon resin, OCD type 7 (produced by Tokyo Oka Inc.) to a thickness of 0.2 μm, so as to form a three-layer intermediate layer 33, which was hard baked for 5 minutes at a temperature of 200° C. (FIG. 18B). On the thus baked layer, there was spin coated a CMS resist (produced by Toso Inc.) to a thickness of 0.5 μm, so as to form a resist film 34, which was prebaked for 90 seconds at a temperature of 80° C. (FIG. 18C). Further, on the prebaked film, there was spin coated the composition used in Example 1 to a thickness of 0.15 μm, so as to form a conductive film 35, which was prebaked for 100 seconds at a temperature of 100° C. (FIG. 18D).

Figure 18E:
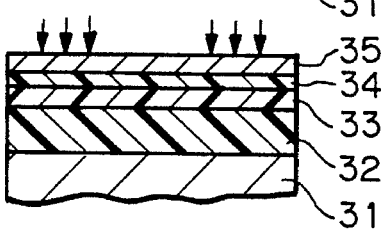
Figure 18F:
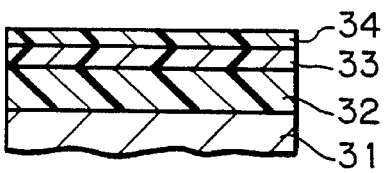
Figure 18G:
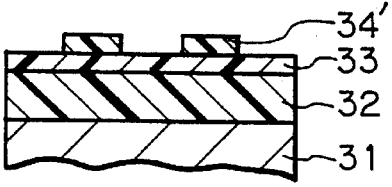
Figure 18H:
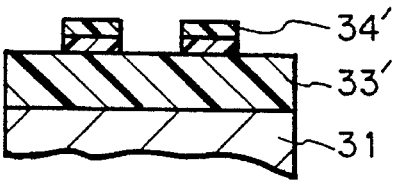
Figure 18I:
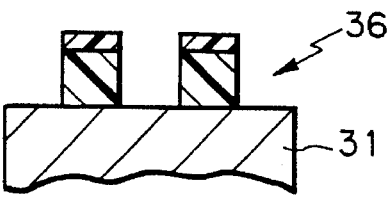

Subsequently, the prebaked conductive film was exposed to an electron beam at an acceleration voltage of 30 kV and an electron dose of 35 μC/cm² (FIG. 18E). Subsequently, the conductive film was removed with a 0.1N ammonium methanol solution by use of a spin developer (FIG. 18F), rinsed with IPA, whereafter the CMS resist was developed with a 1:1 solution mixture of n-butyl ether and ethyl cellosolve and rinsed with IPA, so as to obtain an upper layer resist pattern 34' (FIG. 18G). After the obtained resist pattern had been after-baked for 90 seconds at a temperature of 80° C., by use of a parallel plate type reactive ion etching apparatus, the upper layer resist pattern 34' was transferred to the intermediate layer, under a gas pressure of 2.6 Pa, at an applied frequency of 13.56 MHz, $CF_4$ gas flow rate of 20 sccm, and applied power density of 0.22 W/cm² (FIG. 18H). Further, an intermediate pattern 33' was transferred to the lower layer, by use of a parallel plate type reactive ion etching device, under an oxygen pressure of 2.6 Pa, at an applied frequency of 13.56 MHz, an oxygen gas flow rate of 20 sccm and applied power density of 0.16 W/cm², so that a multilayer resist pattern 36 was obtained (FIG. 18I).

Charge-up prevention effect was examined in the same way as described in Example 1. As a result, it was found that the pattern had completely been prevented from being misregistered. In addition, no adverse effect was recognized to have been given to the sensitivity and resolution of the resist even by the use of the composition for pattern formation of the present working example.

Example 8

Figure 19A:
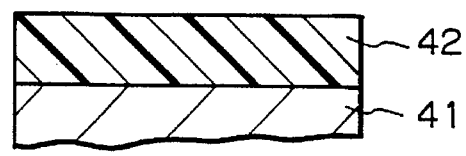
FIGS. 19A to 19F illustrate a flowchart, in which a conductive film is coated on the lower resist in a two-layer resist, so as to form a pattern.
Figure 19B:
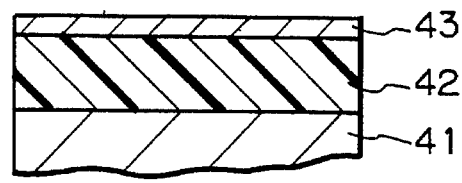
Figure 19C:
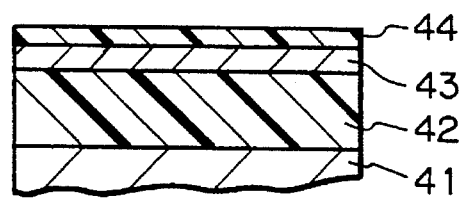
Figure 19D:
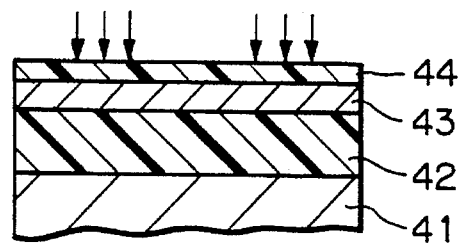
Figure 19E:
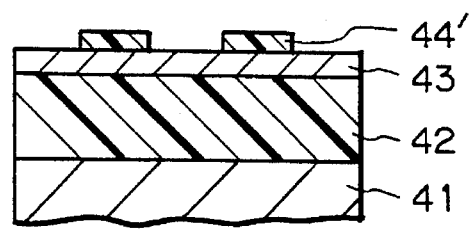
Figure 19F:
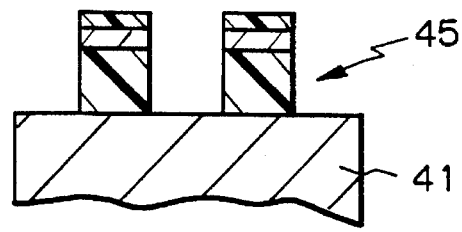

A photo resist OFPR 800 (Tokyo Oka Inc.) was spin coated on a silicon substrate 41 to form a first resist layer 42 with a thickness of 1.0 μm, which was then hard baked at 200° C. for 5 minutes (FIG. 19A). On this first resist layer 42, the composition used in Example 1 was spin coated and then prebaked at 100° C., 100 seconds to form an electrically conductive layer 43 with a thickness of 0.15 μm. A silicone-containing resist Z-SEN (Nippon Zeon Inc.) was spin coated on the electrically conductive layer 43 to form a second resist layer 44 with a thickness of 0.2 μm and prebaked at 80° C. for 90 seconds (FIG. 19C).

An electron beam was scanned on the second resist layer 44 at an acceleration voltage of 30 kV and an electron dose of 20 μC/cm², developed with MIBK in a spin developer and rinsed with IPA to obtain an upper resist pattern 44'. The substrate with the layers were baked at 80° C. for 90 seconds and etching was carried out in a parallel plate type reactive ion etching unit at an oxygen gas pressure of 2.6 Pa, an applied frequency of 13.56 MHz, an oxygen gas flow rate of 20 sccm and an applied power density of $\overline{0.16}$ W/cm² to transfer the upper resist pattern to the lower layers (the electrically conductive layer and first resist layer), to thereby obtain a multilayer resist pattern 45.

A charge-up prevention effect was examined in the same way as described in Example 1. As a result, it was found that the pattern had been completely prevented from being misregistered. In addition, no adverse effect was recognized on the sensitivity and resolving power of the resist even by use of the composition for pattern formation of the present working example.

Example 9

10 parts by weight of the sulfonated polyaniline synthesized in Example 1, 1.0 part by weight of ammonia and 30 parts by weight of a novolak resin ("Sumilite Resin" produced by Sumitomo Durese Inc.) were dissolved in 100 parts by weight of N-methyl-pyrrolidone (NMP).

Figure 20A:
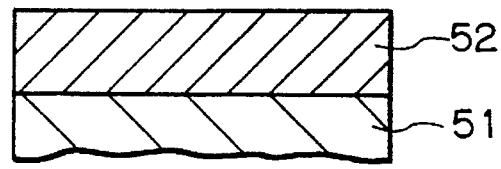
FIGS. 20A to 20E illustrate a flowchart, in which a conductive film is used as a flattened layer of a two-layer resist, so as to form a pattern.
Figure 20B:
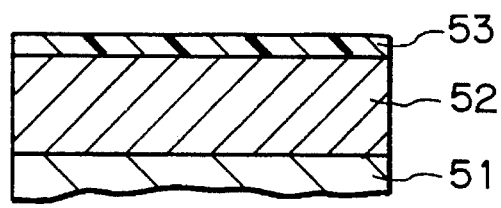

On a silicon substrate 51, there was spin coated the thus obtained solution to a thickness of 1.0 μm, so as to form a conductive film 52, which was subsequently hard baked for 5 minutes at a temperature of 200° C. (FIG. 20A). On the thus baked film, there was spin coated a silicon-containing resist, Z-SEN (produced by Nippon Zeon Inc.) to a thickness of 0.2 μm, so as to form a resist film 53, which was prebaked for 90 seconds at a temperature of 80° C. (FIG. 20B).

Figure 20C:
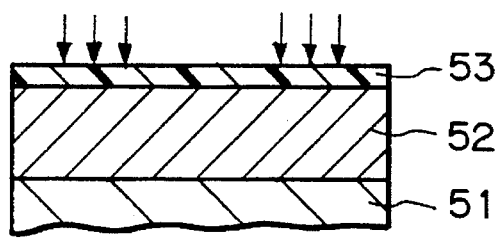
Figure 20D:
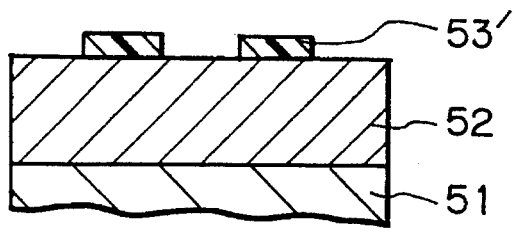
Figure 20E:
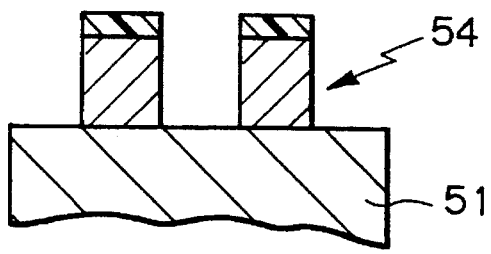

Subsequently, electron beam irradiation was conducted upon the prebaked film at an acceleration voltage of 30 kV and electron dose of 20 μC/cm² (FIG. 20C). Subsequently, the Z-SEN was developed with MIBK, and rinsed with IPA, so as to obtain an upper layer resist pattern 53' (FIG. 20D).

Then, after the obtained upper layer resist pattern 53' had been post-baked for 90 seconds at a temperature of 80° C., it was transferred to the lower layer by using a parallel plate type reaction ion etching under an oxygen pressure of 2.6 Pa, at an applied frequency of 13.56 MHz, an oxygen gas flow rate of 20 sccm, and applied power density of 16 W/cm², so that a multilayer resist pattern 54 was obtained.

Charge-up prevention effect was examined in the same way as described in Example 1. As a result, it was found that the pattern had been completely prevented from being misregistered. In addition, no adverse effect was recognized on the sensitivity and resolution of the resist even by the use of the conductive composition for pattern formation of the present working example.

Example 10

A pattern was formed in the following way by use of the solution obtained in Example 4.

Figure 21A:
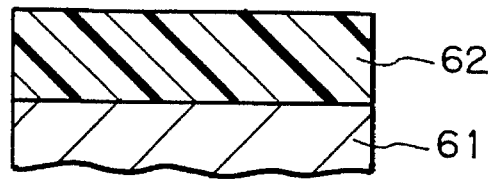
FIGS. 21A to 21E illustrate a flowchart, in which a conductive film is used on the resist of a mask substrate, so as to form a pattern.
Figure 21B:
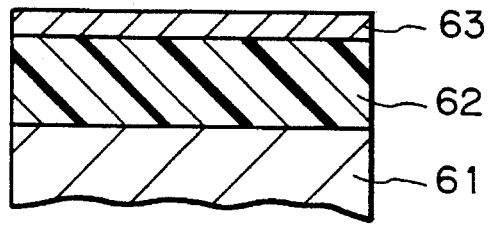
Figure 21C:
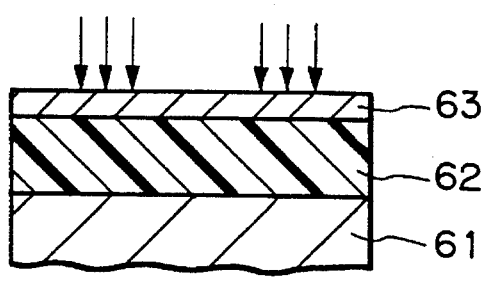
Figure 21D:
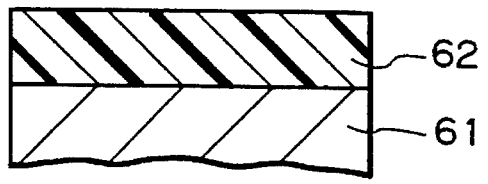
Figure 21E:
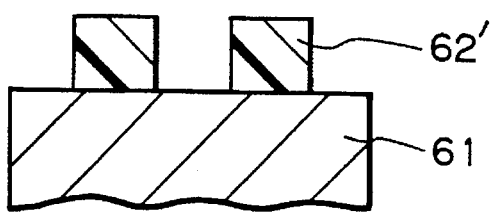

On a mask substrate 61, there was coated by the spin coating method a CMS negative resist with a film thickness of 0.5 μm, so as to form a resist film 62, which was prebaked on a hot plate for 100 seconds at a temperature of 100° C. (FIG. 21A). Subsequently, the present composition for pattern formation was spin coated on the resist film to a film thickness of 0.05 μm, and prebaked on a hot plate for 100 seconds at a temperature of 70° C. (FIG. 21B). Thereafter, patterning by electron beam scan was conducted at an acceleration voltage of 20 kV and an electron dose of 20 μC/cm² (FIG. 21C). Subsequently, the electrically conductive film was removed with a 2.38% by weight of aqueous solution of TMAH by use of a spin developer, and rinsed with pure water (FIG. 21D). The rinsed resist film 62 was then developed with a solution mixture of n-butyl ether/ethylcellosolve=1/1, and rinsed with IPA, so as to obtain a resist pattern 62' (FIG. 21E).

Charge-up prevention effect was examined in the same way as described in Example 1. As a result, it was found that the pattern had completely been prevented from being misregistered. In addition, no adverse effect was recognized on the sensitivity and resolution of the resist even by the use of the composition for pattern formation of the present working example.

Example 11

The following is an example in which the composition obtained in Example 4 is applied as a charge-up preventing process in the case of channel doping (ion-implantation) of an nMOS Si gate process (FIG. 22).

Figure 22A:
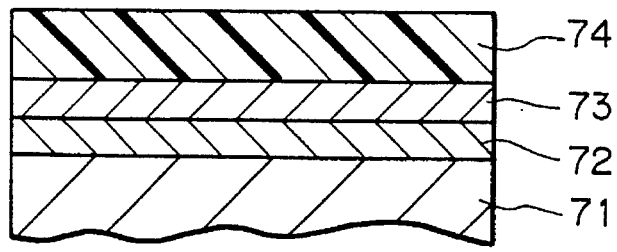
FIGS. 22A to 22E illustrate a flowchart, in which a conductive film is used for channel doping (ion-implantation) of an nMOS Si gate process.

On a p-type Si substrate 71, there is formed an oxide film 72 (1000Å) for LOCOS, and a nitride film 73 (1500Å) was formed thereon. On the substrate, there is coated a photoresist to a thickness of 1.5 μm for patterning, so as to form a resist film 74, which is then prebaked (FIG. 22A).

Figure 22B:
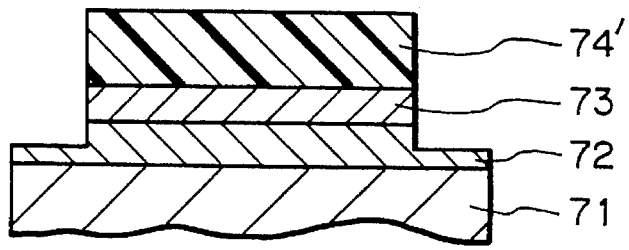

Patterning of the resist is conducted on the part where a transistor is to be formed, so as to form a resist pattern 74', and then the nitride film 73 is etched (FIG. 22B).

Figure 22C:
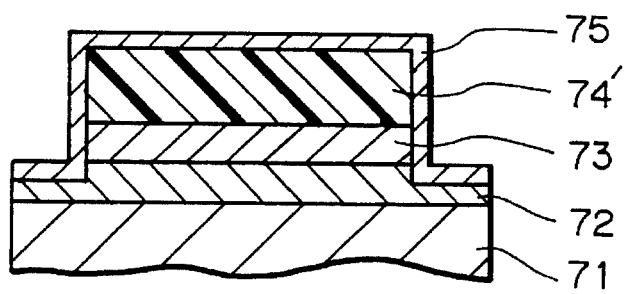
Figure 22D:
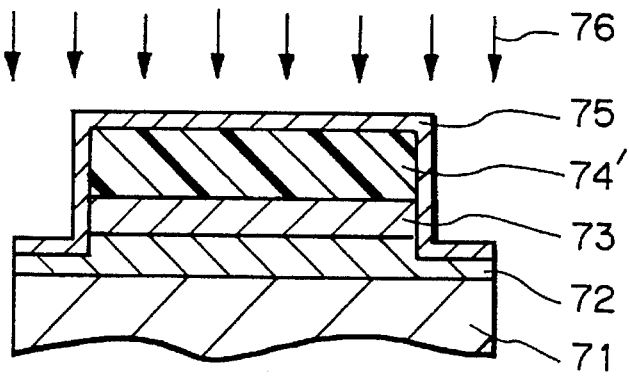

The obtained conductive composition is spin coated on the substrate to a film thickness of 0.08 μm, so that an electrically conductive film 75 is formed and baked for 100 seconds at a temperature of 80° C. (FIG. 22C). In order to form a channel stopper, ion-implantation of $B^+76$ (80 Kev, $1 \times 10^{13} cm^{-2}$) is conducted (FIG. 22D).

Figure 22E:
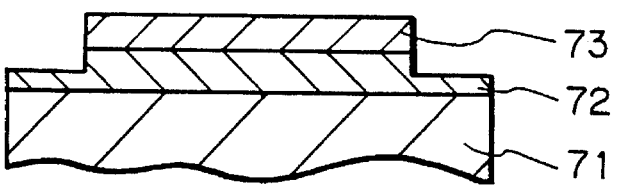

The resist film is removed by a wetting treatment (FIG. 22E). Although it is often possible to remove the electrically conductive film 75, simultaneously with the removing of the resist film 74', if necessary, a step of removing the electrically conductive film may be preliminarily provided. For example, the electrically conductive film is removed by adding dropwise 0.5% by weight of aqueous solution of TMAH for 30 seconds, and then washing with pure water for 20 seconds.

Example 12

The following is an example in which the composition obtained in Example 4 is applied as a charge-up preventing process in the case of ion-implantation for the formation of source-drain in an MOS Si gate process (FIG. 23).

Figure 23A:
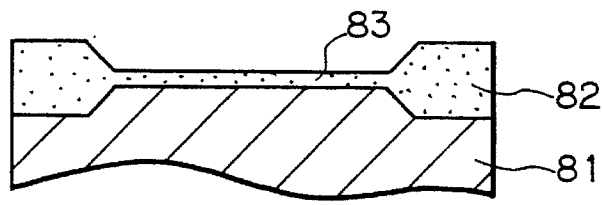
FIGS. 23A to 23E illustrate a flowchart, in which a conductive film is used for the ion-implantation for the formation of the source-drain in an MOS Si gate process.

On a p-type Si substrate 81, there are formed a field oxide film 82 (film thickness: 5000Å) and a gate oxide film 83 (film thickness: 100Å) in this order, and ion-implantation is conducted (FIG. 23A).

Figure 23B:
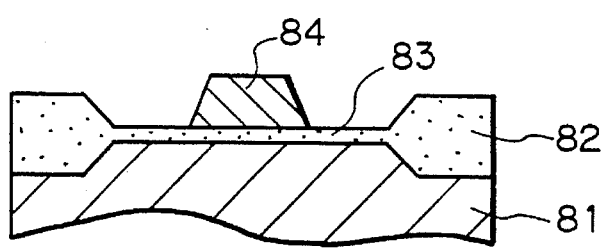

Subsequently, polycrystalline Si (1500Å) is evapodeposited, and a pattern 84 of a gate of the polycrystalline Si is formed, after diffusion and patterning have been conducted (FIG. 23B).

$As^+$ is ion-implanted using the gate as a mask, in order to form a source-drain area, and in this step, the charge-up preventing process is applied.

Figure 23C:
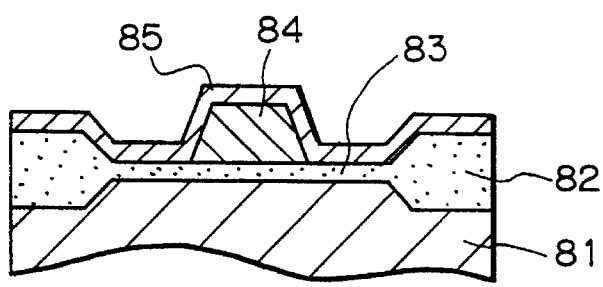

On the obtained substrate, there is coated the conductive composition to a thickness of 0.1 μm, so as to form a conductive film 85, which is subsequently baked for 100 seconds at a temperature of 80° C. (FIG. 23C).

Figure 23D:
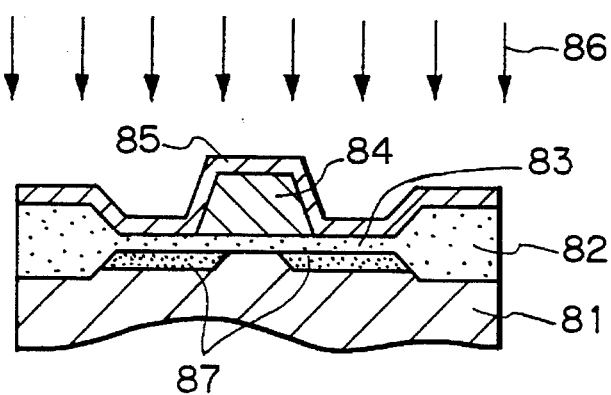

$As^+$ 86 ion-implantation ($5 \times 10^{15} cm^{-2}$, 50 kV) is conducted (FIG. 23D). In this figure, the numeral 87 indicates a source-drain area to which $As^+$ions have been implanted.

Figure 23E:
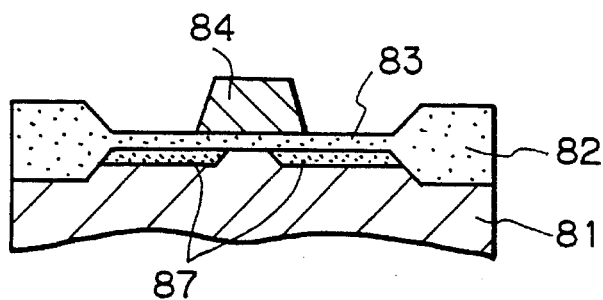

Subsequently, the conductive film is removed by dropwise addition of 0.3% by weight of an aqueous solution of TMAH for 60 seconds, and washed with pure water for 20 seconds (FIG. 23E).

Example 13

10 parts by weight of aniline and 20 parts by weight of aminoanisole sulfonic acid were polymerized under an acid condition attributed to ammonium persulfate to form a copolymer. The obtained copolymer had a sulfonation rate of 35%, a weight average molecular weight of 38,000, and a molecular weight dispersion of 1.4.

3.0 parts by weight of the above copolymer and 0.3 parts by weight of trimethylamine were dissolved in 100 parts by weight of water and filtered to obtain a composition for forming an electrically conductive layer.

Then, the same procedures as in Example 4 were repeated.

As a result, it was found that misregistration of a pattern had been completely prevented. In addition, no adverse effect was recognized to have been given to the sensitivity and resolution of the resist even by the use of the composition for pattern formation of the present invention.

We claim:

1. A composition for forming an electrically conductive layer used in a pattern formation, comprising:
   (a) 0.1 to 20 parts by weight of a sulfonated polyaniline having a number of sulfonic groups being 20 to 80% of the number of aromatic rings of the sulfonated polyaniline, a weight average molecular weight of 1,000 to 200,000 and a molecular weight dispersion of not more than 4.5, said sulfonated polyaniline being a compound represented by one of the following formulae (I) to (V) or a mixture of compounds given by the following formula (I) to (V):

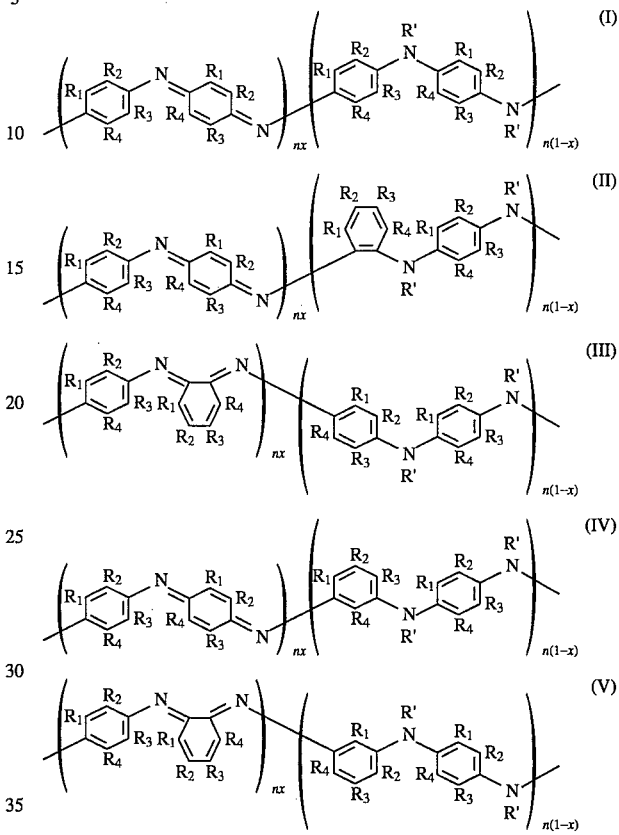

where $R_1$, $R_2$, $R_3$ and $R_4$ each independently denote one of a hydrogen atom, a sulfonic group, a methoxy group, a $C_1$ to $C_2$ alkyl group and a hydroxy group; R' denotes one of a hydrogen atom and a $C_1$ to $C_4$ alkyl; n denotes the polymerization degree and x denotes a real number within the range 0.2 to 0.8;

(b) 100 parts by weight of a solvent, the solvent component (B) being selected from the group consisting of water, an organic solvent selected from the group consisting of alcohols, ketones, cellosolves, propylene glycols, amides and pyrrolidones, and a mixture of water and at least one of said organic solvents; and
   (c) 0.01 to 30 parts by weight of at least one of an alkyl amine and ammonia, the amine being a compound by the following formula:

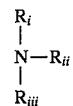

where $R_i$, $R_{ii}$ and $R_{iii}$ independently denote one of a hydrogen atom, a $C_1$ to $C_4$ alkyl, $-CH_2OH$, $-C_2H_4OH$, $-CONH_2$ and $-NH_2$.

2. A composition according to claim 1, further comprising an additional component in an amount of no more than 200 parts by weight, the additional component being at least one of a high molecular weight compound (A) soluble in said solvent, and a surface active agent, compound (A) being selected from the group consisting of water soluble resins, acrylic resins, ester resins, styrenic resins, vinylether resins, polyvinyl alcohols and phenolic resins, the surface active agent being selected from group consisting of anionic surface active agents, cationic surface active agents, amphotic surface active agents, nonionic surface active agents and fluorine-based surface active agents.

3. A composition according to claim 1, wherein said sulfonated polyaniline has a weight average molecular weight of 2,000 to 100,000 and a molecular weight dispersion of not more than 4.0.

4. A composition according to claim 1, wherein said solvent is water.

5. A composition according to claim 1, wherein said solvent is a mixture of water and an organic solvent in a weight ratio of 1/10 to 10/1.

6. A composition according to claim 1, wherein the composition contains said sulfonated polyaniline in an amount of 0.5 to 15 parts by weight.

7. A composition according to claim 1, wherein said solvent does not form a mixed layer with a resist to be used adjacent to the composition.

* * * * *

UNITED STATES PATENT AND TRADEMARK OFFICE
CERTIFICATE OF CORRECTION

PATENT NO. : 5,560,870
DATED : October 1, 1996
INVENTOR(S) : Keiji WATANABE et al.

It is certified that error appears in the above-indentified patent and that said Letters Patent is hereby corrected as shown below:

Col. 1, line 30, change "puttering" to --sputtering--.

*Col. 7, line 19, after "least" insert --one--;

*Col. 14, line 53, change "been" to --be--.

Col. 18, line 65, begin a new paragraph with "In".

Col. 19, line 35, change "As+ions" to --As+ ions--.

Signed and Sealed this

Eighth Day of April, 1997

Attest:

BRUCE LEHMAN

Attesting Officer

Commissioner of Patents and Trademarks